US012772498B2

(12) United States Patent
Park et al.

(10) Patent No.: US 12,772,498 B2
(45) Date of Patent: Oct. 20, 2026

(54) SEMICONDUCTOR DEVICE

(71) Applicant: Samsung Electronics Co., Ltd., Suwon-si (KR)

(72) Inventors: Jisoo Park, Suwon-si (KR); Myung Il Kang, Suwon-si (KR); Ji Wook Kwon, Suwon-si (KR); Jung Han Lee, Suwon-si (KR); Subin Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 666 days.

(21) Appl. No.: 18/334,849

(22) Filed: Jun. 14, 2023

(65) Prior Publication Data

US 2024/0120393 A1 Apr. 11, 2024

(30) Foreign Application Priority Data

Oct. 6, 2022 (KR) ........................ 10-2022-0127953

(51) Int. Cl.
*H10D 30/67* (2025.01)
*H10D 30/43* (2025.01)
(Continued)

(52) U.S. Cl.
CPC ......... *H10D 30/6729* (2025.01); *H10D 30/43* (2025.01); *H10D 30/6735* (2025.01);
(Continued)

(58) Field of Classification Search
CPC ............. H10D 84/853; H10D 30/6735; H10D 30/6757; H10D 62/121; H10D 62/151;
(Continued)

(56) References Cited

U.S. PATENT DOCUMENTS 11,251,308 B2 2/2022 Liao et al.
11,264,327 B2 3/2022 Chiang et al.
(Continued)

FOREIGN PATENT DOCUMENTS

KR 2022/0080855 A 6/2022

OTHER PUBLICATIONS

Korean Notice of Allowance dated Apr. 16, 2026 for corresponding Korean Patent Application No. 10-2022-0127953 and its English-language translation.

*Primary Examiner* — Jonathan Han
(74) *Attorney, Agent, or Firm* — Harness, Dickey & Pierce, P.L.C.

(57) ABSTRACT

A semiconductor device includes a substrate, a first sheet pattern on the substrate, a gate electrode on the substrate and surrounding the first sheet pattern, a first source/drain pattern and a second source/drain pattern respectively connected to a first end and a second end of the first sheet pattern, a contact blocking pattern on a lower side of the second source/drain pattern, a first source/drain contact extending in a first direction and connected to the first source/drain pattern, and a second source/drain contact connected to the second source/drain pattern and extending in the first direction to contact an upper surface of the contact blocking pattern. A depth from an upper surface of the gate electrode to a lowermost portion of the first source/drain contact may be greater than a depth from the upper surface of the gate electrode to the upper surface of the contact blocking pattern.

20 Claims, 23 Drawing Sheets

(51) Int. Cl.
*H10D 62/10* (2025.01)
*H10W 20/20* (2026.01)

(52) U.S. Cl.
CPC ....... *H10D 30/6757* (2025.01); *H10D 62/121* (2025.01); *H10W 20/20* (2026.01)

(58) Field of Classification Search
CPC .... H10D 30/014; H10D 30/43; H10D 64/258; H10D 64/254; H10D 84/85; H10D 84/83; H10D 84/0186; H10D 84/0149; H10D 84/038; H10D 88/00; H10D 88/01; H10D 64/017; H10D 30/019; H10D 30/501; H10D 84/0177; H10D 84/83135; H10D 84/0167; H10D 84/017; H10D 62/364; H10D 30/6729; H10D 62/118; H10D 62/119; H10D 62/116; H10D 62/149; H10D 64/251; H10D 84/856; H10D 30/6713; H01L 23/481; H01L 23/485; H01L 23/5286; B82Y 10/00; H10B 10/12; H10W 20/20
See application file for complete search history.

(56) References Cited

U.S. PATENT DOCUMENTS

| | | | | |
|---|---|---|---|---|
| 11,315,923 | B2 * | 4/2022 | Reznicek | H10D 30/6757 |
| 12,051,692 | B2 * | 7/2024 | Shi | H10D 62/119 |
| 2021/0399109 | A1 | 12/2021 | Su et al. | |
| 2021/0408247 | A1 | 12/2021 | Yu et al. | |
| 2022/0102266 | A1 | 3/2022 | Lim et al. | |
| 2022/0157723 | A1 | 5/2022 | Park et al. | |
| 2022/0165848 | A1 | 5/2022 | Lin et al. | |
| 2023/0130305 | A1 * | 4/2023 | Xie | H01L 23/5286 257/369 |
| 2023/0345691 | A1 * | 10/2023 | Xie | H10D 30/6757 |
| 2024/0030136 | A1 * | 1/2024 | Chang | H01L 23/5286 |

* cited by examiner

SEMICONDUCTOR DEVICE

CROSS-REFERENCE TO RELATED APPLICATION

This application claims priority from Korean Patent Application No. 10-2022-0127953, filed on Oct. 6, 2022 in the Korean Intellectual Property Office, and all the benefits accruing therefrom under 35 U.S.C. 119, the entire contents of which are herein incorporated by reference.

BACKGROUND

1. Technical Field

The present disclosure relates to a semiconductor device.

2. Description of the Related Art

As one of the scaling techniques for increasing a density of semiconductor devices, a multi-gate transistor, in which a multi-channel active pattern (or silicon body) having a fin or nanowire shape may be formed on a substrate and a gate may be formed on a surface of the multi-channel active pattern, has been proposed.

Since such a multi-gate transistor uses a three-dimensional channel, it may be easy to perform scaling. In addition, the multi-gate transistor may improve current control capability even without increasing a length of the gate of the multi-gate transistor. In addition, the multi-gate transistor may effectively limit or suppress a short channel effect (SCE) in which a potential of a channel region may be affected by a drain voltage.

Meanwhile, as a pitch size of the semiconductor device decreases, research for reducing capacitance and securing electrical stability between contacts in the semiconductor device may be required.

SUMMARY

Aspects of the present disclosure provide a semiconductor device capable of improving performance and/or reliability of an element.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an example embodiment, a semiconductor device may include a substrate including an upper surface and a lower surface that are opposite each other in a first direction; a first sheet pattern on the upper surface of the substrate, the first sheet pattern including a first end and a second end; a gate electrode extending in a second direction on the upper surface of the substrate, the gate electrode surrounding the first sheet pattern; a first source/drain pattern connected to the first end of the first sheet pattern; a second source/drain pattern connected to the second end of the first sheet pattern; a contact blocking pattern on a lower side of the second source/drain pattern, the contact blocking pattern including an upper surface and a lower surface that are opposite each other in the first direction; a first source/drain contact extending in the first direction, the first source/drain contact being connected to the first source/drain pattern; and a second source/drain contact in contact with the upper surface of the contact blocking pattern. The second source/drain contact may extend in the first direction, and the second source/drain contact may be connected to the second source/drain pattern. A depth from an upper surface of the gate electrode to a lowermost portion of the first source/drain contact may be greater than a depth from the upper surface of the gate electrode to the upper surface of the contact blocking pattern.

According to an example embodiment, a semiconductor device may include a substrate including an upper surface and a lower surface that are opposite each other in a first direction; a first sheet pattern on the upper surface of the substrate, the first sheet pattern including a first end and a second end; a gate electrode extending in a second direction on the upper surface of the substrate, the gate electrode surrounding the first sheet pattern; a first source/drain pattern connected to the first end of the first sheet pattern; a second source/drain pattern connected to the second end of the first sheet pattern; a first source/drain contact extending in the first direction, the first source/drain contact being connected to the first source/drain pattern; and a second source/drain contact extending in the first direction, the second source/drain contact being connected to the second source/drain pattern. A depth from an upper surface of the gate electrode to a lowermost portion of the first source/drain contact may be greater than a depth from the upper surface of the gate electrode to a lowermost portion of the first source/drain pattern. A depth from the upper surface of the gate electrode to a lowermost portion of the second source/drain contact may be greater than or equal to a depth from the upper surface of the gate electrode to a lowermost portion of the second source/drain pattern.

According to an example embodiment, a semiconductor device may include a substrate including an upper surface and a lower surface that are opposite each other in a first direction; a sheet pattern on the upper surface of the substrate, the sheet pattern including a first end and a second end; a gate electrode extending in a second direction on the upper surface of the substrate, the gate electrode surrounding the sheet pattern; a first source/drain pattern connected to the first end of the sheet pattern; a second source/drain pattern connected to the second end of the sheet pattern; a contact blocking pattern in the substrate; a first source/drain contact connected to the first source/drain pattern, the first source/drain contact penetrating through the substrate; and a second source/drain contact connected to the second source/drain pattern, the second source/drain contact being in contact with the contact blocking pattern.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF THE EMBODIMENTS

Figure 1:
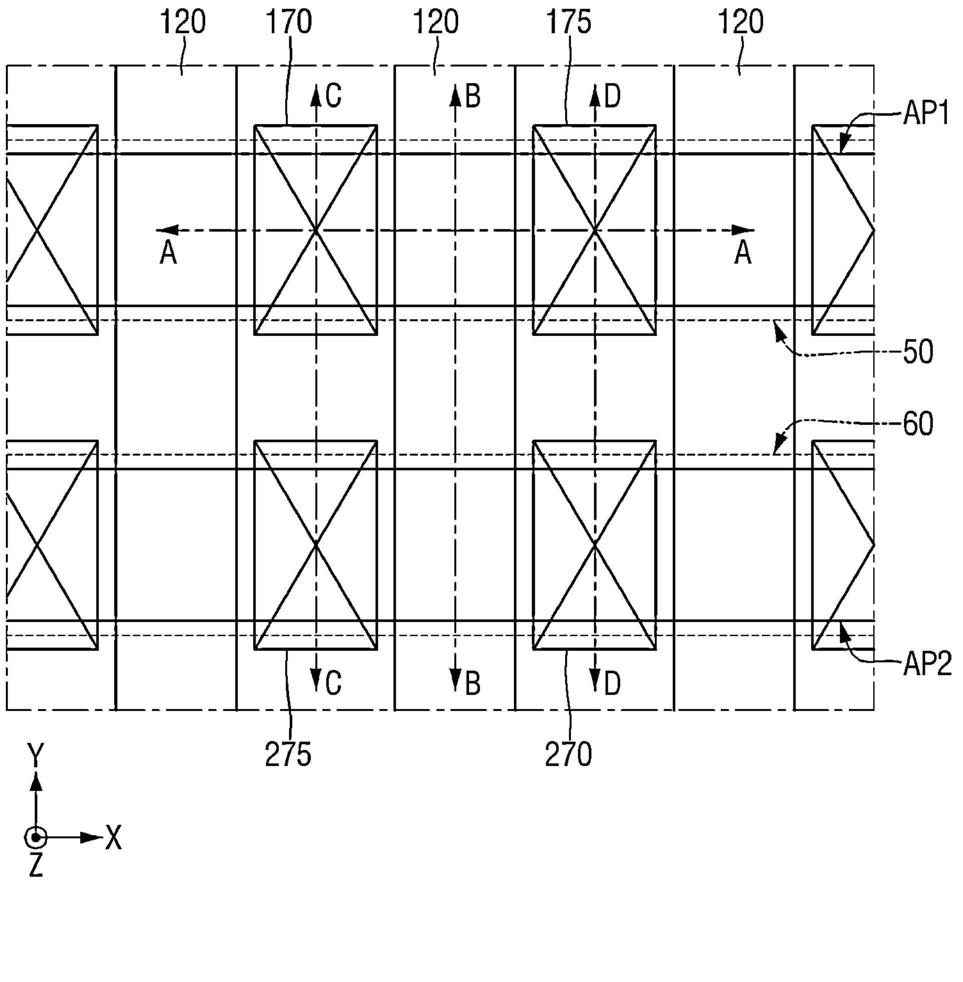
FIG. 1 is a layout view for describing a semiconductor device according to some embodiments.

Terms "first", "second" and the like are used herein to describe various elements or components, but these elements or components are not limited by these terms. These terms are used only to distinguish one element or component from another element or component. Therefore, a first element or component mentioned below may be a second element or component within the technical spirit of the present disclosure.

In the drawings of the semiconductor device according to some embodiments, a transistor including a nanowire or a nanosheet, and a multi-bridge channel field effect transistor (MBCFET™) are illustrated, but the present disclosure is not limited thereto. The semiconductor device according to some embodiments may also be applied to a fin-type transistor (FinFET) including a channel region having a fin-type pattern shape.

The semiconductor device according to some embodiments may include a tunneling FET, a three-dimensional (3D) transistor, or a vertical FET. The semiconductor device according to some embodiments may include a planar transistor. In addition, a technical idea of the present disclosure may be applied to two-dimensional (2D) material based FETs and a heterostructure thereof.

In addition, the semiconductor device according to some embodiments may also include a bipolar junction transistor, a lateral double-diffused metal oxide semiconductor (LDMOS) transistor, or the like.

The semiconductor device according to some embodiments will be described with reference to FIGS. 1 to 6.

Figure 2:
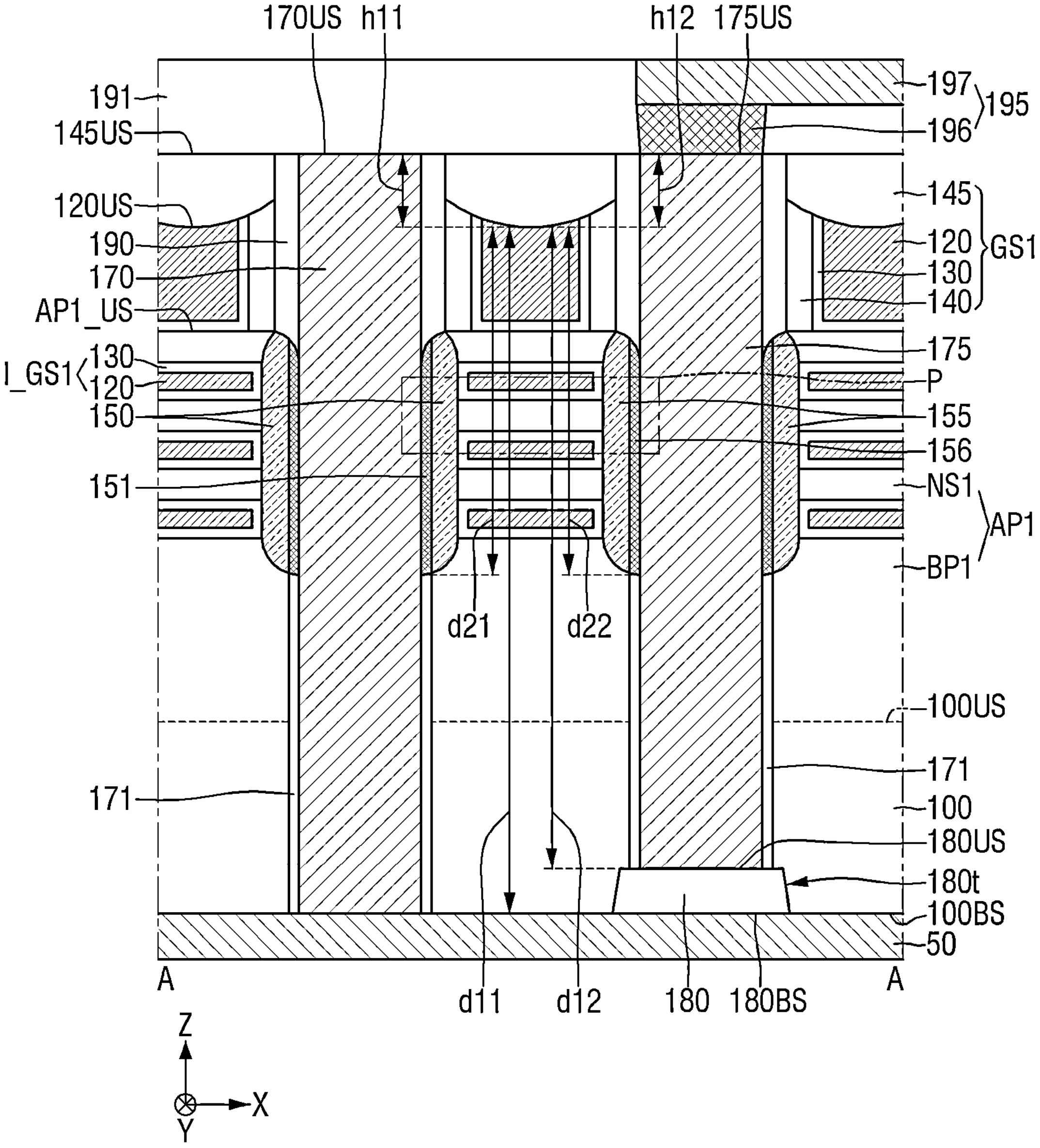
FIG. 2 is a cross-sectional view taken along line A-A of FIG. 1.
Figure 3:
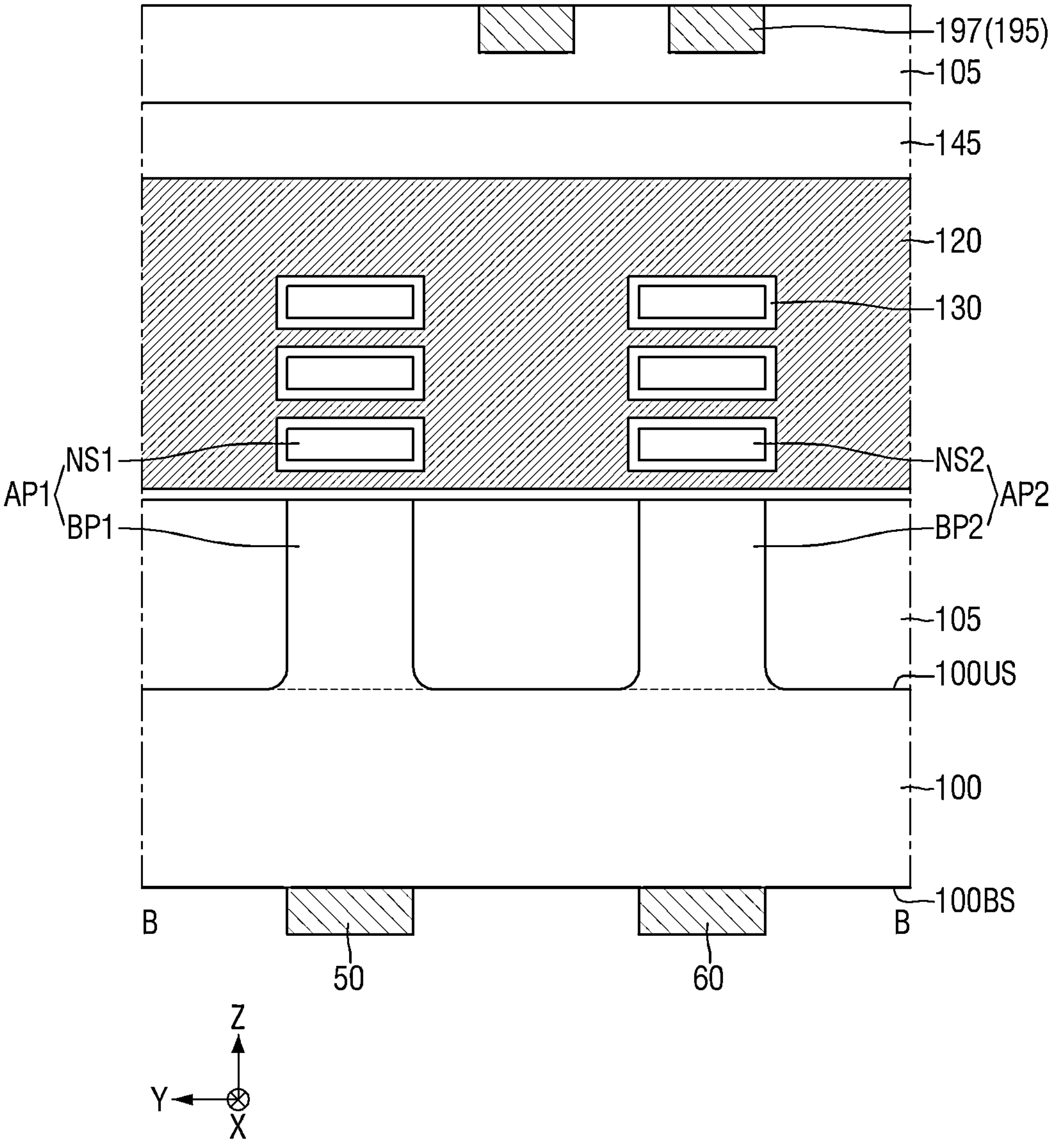
FIG. 3 is a cross-sectional view taken along line B-B of FIG. 1.
Figure 4:
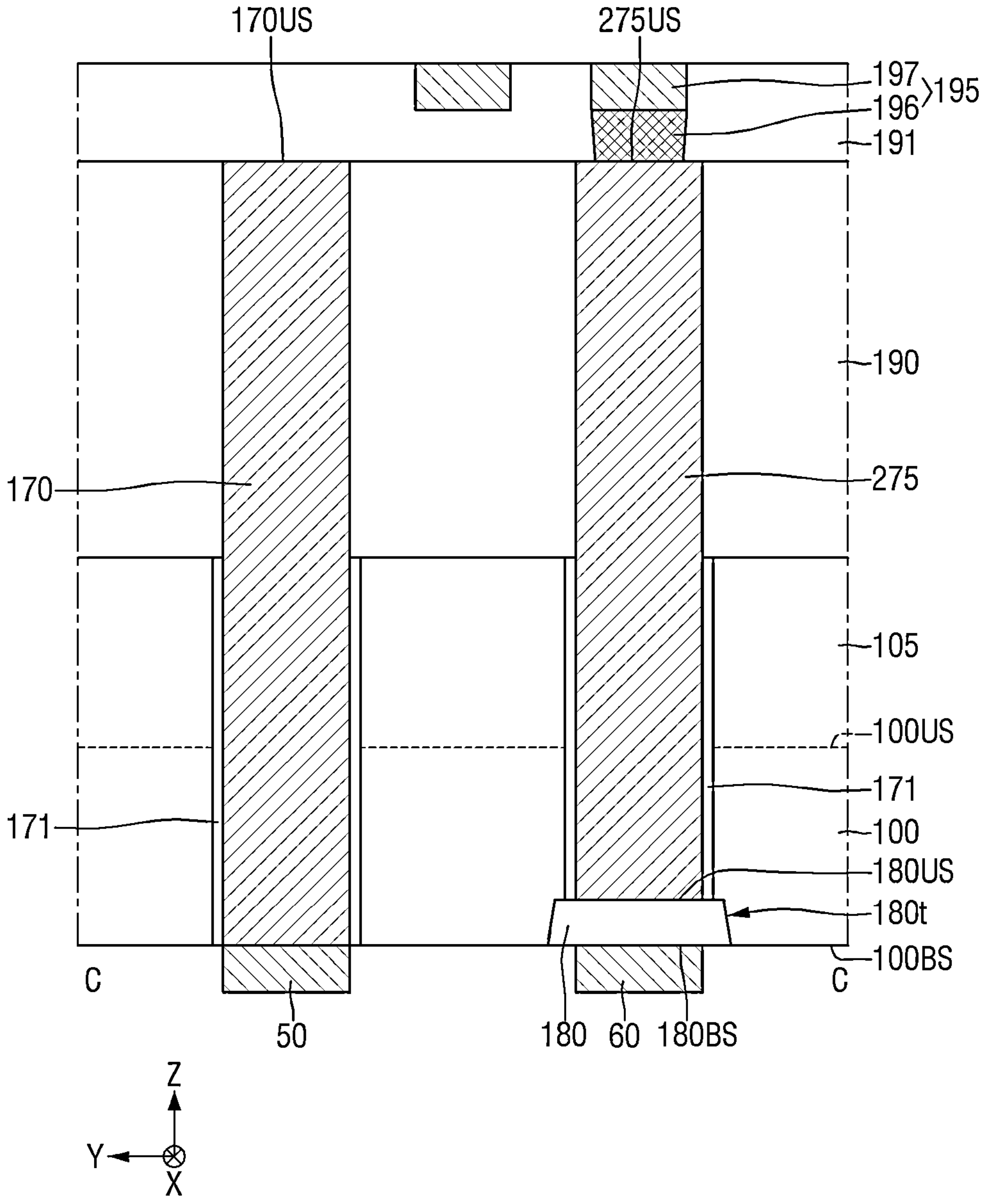
FIG. 4 is a cross-sectional view taken along line C-C of FIG. 1.
Figure 5:
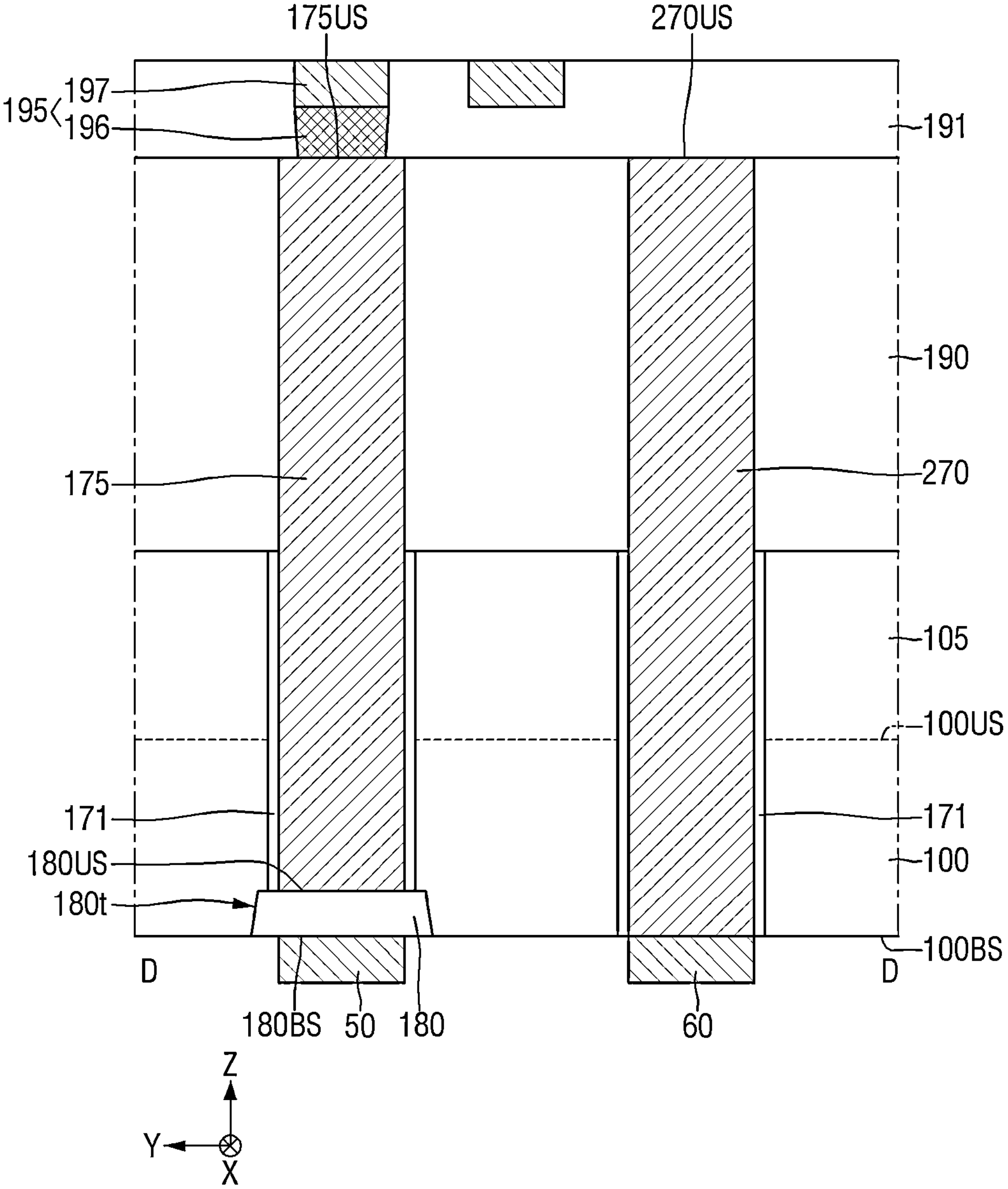
FIG. 5 is a cross-sectional view taken along line D-D of FIG. 1.
Figure 6:
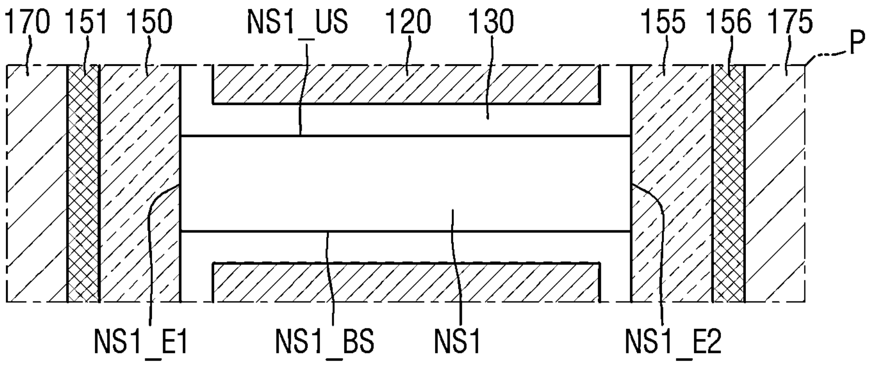
FIG. 6 is an enlarged view of part P of FIG. 2.

FIG. 1 is a layout view for describing a semiconductor device according to some embodiments. FIG. 2 is a cross-sectional view taken along line A-A of FIG. 1. FIG. 3 is a cross-sectional view taken along line B-B of FIG. 1. FIG. 4 is a cross-sectional view taken along line C-C of FIG. 1. FIG. 5 is a cross-sectional view taken along line D-D of FIG. 1. FIG. 6 is an enlarged view of part P of FIG. 2. For convenience of explanation, a wiring structure 195 is not illustrated in FIG. 1.

Although not illustrated, a cross-sectional view taken along a second active pattern AP2 in a first direction X may be similar to FIG. 2.

Referring to FIGS. 1 to 6, a semiconductor device according to some embodiments may include a first active pattern AP1, a second active pattern AP2, a plurality of first gate electrodes 120, a first source/drain pattern 150, a second source/drain pattern 155, a first power source/drain contact 170, a second power source/drain contact 270, a first source/drain contact 175, a second source/drain contact 275, and a first contact blocking pattern 180.

A substrate 100 may include an upper surface 100US and a lower surface 100BS that are opposite each other in a third direction Z. The substrate 100 may be bulk silicon or silicon-on-insulator (SOI). In some embodiments, the substrate 100 may be a silicon substrate, and may include another material, for example, silicon germanium, silicon germanium on insulator (SGOI), indium antimonide, lead tellurium compound, indium arsenide, indium phosphide, gallium arsenide, or gallium antimonide, but is not limited thereto.

The first active pattern AP1 and the second active pattern AP2 may be respectively disposed on the substrate 100. For example, the first active pattern AP1 and the second active pattern AP2 may be disposed on the upper surface 100US of the substrate. Each of the first active pattern AP1 and the second active pattern AP2 may extend to be long in a first direction X.

The first active pattern AP1 and the second active pattern AP2 may be disposed to be spaced apart from each other in a second direction Y. The first active pattern AP1 and the second active pattern AP2 may be adjacent to each other in the second direction Y.

Although the first active pattern AP1 is illustrated as being closest to the second active pattern AP2 in the second direction Y, the present disclosure is not limited thereto. One or more additional active patterns may also be disposed between the first active pattern AP1 and the second active pattern AP2.

As an example, the first active pattern AP1 may be an area in which a p-type transistor may be formed, and the second active pattern AP2 may be an area in which an n-type transistor may be formed. As another example, the first active pattern AP1 and the second active pattern AP2 may be areas in which a p-type transistor may be formed. As still another example, the first active pattern AP1 and the second active pattern AP2 may be areas in which an n-type transistor may be formed. Hereinafter, the first active pattern AP1 and the second active pattern AP2 will be described as areas in which transistors of different conductivity types are formed.

Each of the first active pattern AP1 and the second active pattern AP2 may be a multi-channel active pattern. For example, the first active pattern AP1 may include a first lower pattern BP1 and a plurality of first sheet patterns NS1. The second active pattern AP2 may include a second lower pattern BP2 and a plurality of second sheet patterns NS2. In the semiconductor device according to some embodiments, each of the first and second active patterns AP1 and AP2 may be an active pattern including nanosheets or nanowires.

Each of the first lower pattern BP1 and the second lower pattern BP2 may protrude from the substrate 100. For example, each of the first lower pattern BP1 and the second lower pattern BP2 may protrude from the upper surface 100US of the substrate. Each of the first lower pattern BP1 and the second lower pattern BP2 may have a fin-type pattern shape.

The first lower pattern BP1 may be spaced apart from the second lower pattern BP2 in the second direction Y. The first lower pattern BP1 and the second lower pattern BP2 may be separated by a fin trench extending in the first direction X. The upper surface 100US of the substrate may be a bottom surface of the fin trench.

The plurality of first sheet patterns NS1 may be disposed on the first lower pattern BP1. The plurality of first sheet patterns NS1 may be spaced apart from the first lower pattern BP1 in the third direction Z. The plurality of first sheet patterns NS1 may be disposed on the upper surface 100US of the substrate.

The plurality of second sheet patterns NS2 may be disposed on the second lower pattern BP2. The plurality of second sheet patterns NS2 may be spaced apart from the second lower pattern BP2 in the third direction Z. The plurality of second sheet patterns NS2 may be disposed on the upper surface 100US of the substrate.

Here, the first direction X may intersect the second direction Y and a third direction Z. In addition, the second direction Y may intersect the third direction Z. The third direction Z may be a thickness direction of the substrate 100.

Although it is illustrated that three first sheet patterns NS1 and three second sheet patterns NS2 are disposed in the third direction Z, respectively, it is only for convenience of explanation, and the present disclosure is not limited thereto.

In FIGS. 2 to 6, the first sheet pattern NS1 may include an upper surface NS1_US and a lower surface NS1_BS. The upper surface NS1_US of the first sheet pattern may be a surface opposite to the lower surface NS1_BS of the first sheet pattern in the third direction Z. The lower surface NS1_BS of the first sheet pattern may face the substrate 100.

The first sheet pattern NS1 may include a first end NS1_E1 and a second end NS1_E2. The first end NS1_E1 of the first sheet pattern is spaced apart from the second end NS1_E2 of the first sheet pattern in the first direction X. The first end NS1_E1 of the first sheet pattern and the second end NS1_E2 of the first sheet pattern may be portions connected to source/drain patterns 150 and 155 to be described later, respectively.

The first sheet pattern NS1 may include a first uppermost sheet pattern farthest from the substrate 100. An upper surface AP1_US of the first active pattern may be an upper surface of the first uppermost sheet pattern of the first sheet pattern NS1. Descriptions of the second active pattern AP2 and the second sheet pattern NS2 may be substantially the same as those of the first active pattern AP1 and the first sheet pattern NS1.

Each of the first lower pattern BP1 and the second lower pattern BP2 may be formed by etching a portion of the substrate 100, and may include an epitaxial layer grown from the substrate 100. Each of the first lower pattern BP1 and the second lower pattern BP2 may include silicon or germanium, which is an elemental semiconductor material. In addition, each of the first lower pattern BP1 and the second lower pattern BP2 may include a compound semiconductor, for example, a group IV-IV compound semiconductor or a group III-V compound semiconductor.

The group IV-IV compound semiconductor may be, for example, a binary compound or a ternary compound including at least two or more of carbon (C), silicon (Si), germanium (Ge), and tin (Sn), or a compound obtained by doping the binary compound or the ternary compound with a group IV element.

The III-V compound semiconductor may be, for example, one of a binary compound, a ternary compound, or a quaternary compound formed by combining at least one of aluminum (Al), gallium (Ga), and indium (In), which are group III elements, and one of phosphorus (P), arsenic (As), and antimony (Sb), which are group V elements.

Each of the first sheet pattern NS1 and the second sheet pattern NS2 may include one of silicon or germanium, which is an elemental semiconductor material, a group IV-IV compound semiconductor, or a group III-V compound semiconductor. A width of the first sheet pattern NS1 in the second direction Y may increase or decrease in proportion to a width of the first lower pattern BP1 in the second direction Y. A width of the second sheet pattern NS2 in the second direction Y may increase or decrease in proportion to a width of the second lower pattern BP2 in the second direction Y.

A field insulating layer 105 may be disposed on the upper surface 100US of the substrate. The field insulating layer 105 may fill the fin trench separating the first lower pattern BP1 and the second lower pattern BP2.

The field insulating layer 105 may be disposed on the substrate 100 between the first lower pattern BP1 and the second lower pattern BP2. The field insulating layer 105 may be in contact with the first lower pattern BP1 and the second lower pattern BP2.

As an example, the field insulating layer 105 may entirely cover a sidewall of the first lower pattern BP1 and a sidewall of the second lower pattern BP2. Unlike illustrated, as another example, the field insulating layer 105 may cover a portion of the sidewall of the first lower pattern BP1 and/or a portion of the sidewall of the second lower pattern BP2. For example, a portion of the first lower pattern BP1 and/or a portion of the second lower pattern BP2 may protrude further in the third direction Z than an upper surface of the field insulating layer 105. The field insulating layer 105 does not cover the upper surface of the first lower pattern BP1 and the upper surface of the second lower pattern BP2. Each of the first sheet patterns NS1 and each of the second sheet patterns NS2 may be disposed to be higher than an upper surface of the field insulating layer 105.

The field insulating layer 105 may include, for example, an oxide layer, a nitride layer, an oxynitride layer, or a combination thereof. The field insulating layer 105 is illustrated as a single layer, but is not limited thereto. Unlike illustrated, the field insulating layer 105 may also include a field liner extending along a sidewall and a bottom surface of the fin trench and a field filling layer on the field liner.

A plurality of first gate structures GS1 may be disposed on the upper surface 100US of the substrate. Each of the first gate structures GS1 may extend in the second direction Y. The first gate structures GS1 may be disposed to be spaced apart from each other in the first direction X. The first gate structures GS1 may be adjacent to each other in the first direction X.

The first gate structure GS1 may be disposed on the first active pattern AP1 and the second active pattern AP2. The first gate structure GS1 may intersect the first active pattern AP1 and the second active pattern AP2. The first gate structure GS1 may intersect the first lower pattern BP1 and the second lower pattern BP2. The first gate structure GS1 may surround each of the first sheet patterns NS1. The first gate structure GS1 may surround each of the second sheet patterns NS2.

Although it is illustrated that the first gate structure GS1 is disposed across the first active pattern AP1 and the second active pattern AP2, it is only for convenience of explanation and the present disclosure is not limited thereto. That is, a portion of the first gate structure GS1 may be separated into two portions by a gate separation structure disposed on the field insulating layer 105 and may be disposed on the first active pattern AP1 and the second active pattern AP2.

The first gate structure GS1 may include, for example, a first gate electrode 120, a first gate insulating layer 130, a first gate spacer 140, and a first gate capping pattern 145.

The first gate structure GS1 may include a plurality of first inner gate structures I_GS1 disposed between the first sheet patterns NS1 adjacent in the third direction Z and between the first lower pattern BP1 and the first sheet pattern NS1. The first inner gate structure I_GS1 may be disposed between the upper surface of the first lower pattern BP1 and the lower surface NS1_BS of the first sheet pattern and between the upper surface NS1_US of the first sheet pattern and the lower surface NS1_BS of the first sheet pattern facing in the third direction Z.

The number of the first inner gate structures I_GS1 may be the same as the number of the first sheet patterns NS1. The first inner gate structure I_GS1 may be in contact with the upper surface BP1_US of the first lower pattern, the upper surface NS1_US of the first sheet pattern, and the lower surface NS1_BS of the first sheet pattern. In the semiconductor device according to some embodiments, the first inner gate structure I_GS1 may be in contact with source/drain patterns 150 and 155 to be described later.

The first inner gate structure I_GS1 includes a first gate electrode 120 and a first gate insulating layer 130 disposed between the first sheet patterns NS1 adjacent to each other and between the first lower pattern BP1 and the first sheet pattern NS1.

Although not illustrated, the inner gate structure I_GS1 may be disposed between the second sheet patterns NS2 adjacent to each other in the third direction Z and between the second lower pattern BP2 and the second sheet pattern NS2.

The first gate electrode 120 may be disposed on the first lower pattern BP1. The first gate electrode 120 may intersect the first lower pattern BP1. The first gate electrode 120 may surround the first sheet pattern NS1.

In the cross-sectional view of FIG. 2, an upper surface 120US of the first gate electrode is illustrated as a concave curved surface, but is not limited thereto. The upper surface 120US of the first gate electrode may also be a planar surface.

The first gate electrode 120 may include at least one of a metal, a metal alloy, conductive metal nitride, metal silicide, a doped semiconductor material, conductive metal oxide, and conductive metal oxynitride. The first gate electrode 120 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlCN), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (NiPt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof, but is not limited thereto. The conductive metal oxide and the conductive metal oxynitride may include an oxidized form of the above-described material, but are not limited thereto.

The first gate insulating layer 130 may extend along the upper surface of the field insulating layer 105, the upper surface of the first lower pattern BP1, and the upper surface of the second lower pattern BP2. The first gate insulating layer 130 may surround the plurality of first sheet patterns NS1. The first gate insulating layer 130 may surround the plurality of second sheet patterns NS2. The first gate insulating layer 130 may be disposed along a circumference of the first sheet pattern NS1 and a circumference of the second sheet pattern NS2. The first gate electrode 120 may be disposed on the first gate insulating layer 130. The first gate insulating layer 130 may be disposed between the first gate electrode 120 and the first sheet pattern NS1 and between the first gate electrode 120 and the second sheet pattern NS2.

The first gate insulating layer 130 may include silicon oxide, silicon oxynitride, silicon nitride, or a high-k material having a dielectric constant greater than that of the silicon oxide. The high-k material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

Although the first gate insulating layer 130 is illustrated as a single layer, it is only for convenience of explanation and the present disclosure is not limited thereto. The first gate insulating layer 130 may include a plurality of layers. The first gate insulating layer 130 may also include an interfacial layer and a high-k insulating layer disposed between the first active pattern AP1 and the first gate electrode 120 and between the second active pattern AP2 and the first gate electrode 120. For example, the interface layer may not be formed along a profile of the upper surface of the field insulating layer 105.

The semiconductor device according to some embodiments may include a negative capacitance (NC) FET using a negative capacitor. For example, the first gate insulating layer 130 may include a ferroelectric material layer having ferroelectric characteristics and a paraelectric material layer having paraelectric characteristics.

The ferroelectric material layer may have a negative capacitance, and the paraelectric material layer may have a positive capacitance. For example, when two or more capacitors are connected in series with each other and the capacitance of each capacitor has a positive value, a total capacitance decreases as compared with a capacitance of each individual capacitor. On the other hand, when at least one of the capacitances of two or more capacitors connected in series with each other has a negative value, the total capacitance may be greater than an absolute value of each individual capacitance while having a positive value.

When the ferroelectric material layer having the negative capacitance and the paraelectric material layer having the positive capacitance are connected in series with each other, a total capacitance value of the ferroelectric material layer and the paraelectric material layer connected in series with each other may increase. A transistor including the ferroelectric material layer may have a subthreshold swing (SS) less than 60 mV/decade at room temperature by using the increase in the total capacitance value.

The ferroelectric material layer may have the ferroelectric characteristics. The ferroelectric material layer may include, for example, at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may also be a compound of hafnium (Hf), zirconium (Zr), and oxygen (O).

The ferroelectric material layer may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). A type of dopant included in the ferroelectric material layer may vary depending on a type of ferroelectric material included in the ferroelectric material layer.

When the ferroelectric material layer includes hafnium oxide, the dopant included in the ferroelectric material layer may include, for example, at least one of gadolinium (Gd), silicon (Si), zirconium (Zr), aluminum (Al), and yttrium (Y).

When the dopant is aluminum (Al), the ferroelectric material layer may include 3 to 8 atomic % (at %) of aluminum. Here, a ratio of the dopant may be a ratio of aluminum to the sum of hafnium and aluminum.

When the dopant is silicon (Si), the ferroelectric material layer may include 2 to 10 at % of silicon. When the dopant is yttrium (Y), the ferroelectric material layer may include 2 to 10 at % of yttrium. When the dopant is gadolinium (Gd), the ferroelectric material layer may contain 1 to 7 at % of gadolinium. When the dopant is zirconium (Zr), the ferroelectric material layer may include 50 to 80 at % of zirconium.

The paraelectric material layer may have the paraelectric characteristics. The paraelectric material layer may include, for example, at least one of silicon oxide and metal oxide having a high dielectric constant. The metal oxide included in the paraelectric material layer may include, for example, at least one of hafnium oxide, zirconium oxide, and aluminum oxide, but is not limited thereto.

The ferroelectric material layer and the paraelectric material layer may include the same material. The ferroelectric material layer may have the ferroelectric characteristics, but the paraelectric material layer may not have the ferroelectric characteristics. For example, when the ferroelectric material layer and the paraelectric material layer include the hafnium oxide, a crystal structure of the hafnium oxide included in the ferroelectric material layer is different from a crystal structure of the hafnium oxide included in the paraelectric material layer.

The ferroelectric material layer may have a thickness having the ferroelectric characteristics. The thickness of the ferroelectric material layer may be, for example, 0.5 to 10 nm, but is not limited thereto. Since a critical thickness representing the ferroelectric characteristics may vary for each ferroelectric material, the thickness of the ferroelectric material layer may vary depending on the ferroelectric material.

As an example, the first gate insulating layer 130 may include one ferroelectric material layer. As another example, the first gate insulating layer 130 may include a plurality of ferroelectric material layers spaced apart from each other. The first gate insulating layer 130 may have a stacked layer structure in which a plurality of ferroelectric material layers and a plurality of paraelectric material layers are alternately stacked.

The first gate spacer 140 may be disposed on a sidewall of the first gate electrode 120. The first gate spacer 140 may not be disposed between the first lower pattern BP1 and the first sheet pattern NS1 and between the first sheet patterns NS1 adjacent to each other in the third direction Z.

The first gate spacer 140 may include, for example, at least one of silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), and a combination thereof. Although each of the first gate spacers 140 is illustrated as being a single layer, it is only for convenience of explanation and the present disclosure is not limited thereto.

The first gate capping pattern 145 may be disposed on the first gate electrode 120. An upper surface 145US of the first gate capping pattern may be on the same plane as an upper surface of a first interlayer insulating layer 190. Unlike illustrated, the first gate capping pattern 145 may be disposed between the first gate spacers 140.

The first gate capping pattern 145 may include, for example, at least one of silicon nitride (SiN), silicon oxynitride (SiON), silicon carbonitride (SiCN), silicon oxycarbonitride (SiOCN), and a combination thereof. The first gate capping pattern 145 may include a material having an etch selectivity with respect to the first interlayer insulating layer 190.

A first source/drain pattern 150 may be disposed on the first active pattern AP1. The first source/drain pattern 150 may be disposed on the first lower pattern BP1.

The first source/drain pattern 150 may be disposed between the first gate electrodes 120 adjacent to each other in the first direction X. The first source/drain pattern 150 may be in contact with the first sheet pattern NS1. The first source/drain pattern 150 may be connected to the first end NS1_E1 of the first sheet pattern NS1.

The first source/drain pattern 150 may include a first portion and a second portion separated from each other. The first portion of the first source/drain pattern 150 and the second portion of the first source/drain pattern 150 are spaced apart from each other in the first direction X.

A second source/drain pattern 155 may be disposed on the first active pattern AP1. The second source/drain pattern 155 may be disposed on the first lower pattern BP1.

The second source/drain pattern 155 may be disposed between the first gate electrodes 120 adjacent to each other in the first direction X. The second source/drain pattern 155 may be in contact with the first sheet pattern NS1. The second source/drain pattern 155 may be connected to the second end NS1_E2 of the first sheet pattern NS1.

The second source/drain pattern 155 may include a first portion and a second portion separated from each other. The first portion of the second source/drain pattern 155 and the second portion of the second source/drain pattern 155 are spaced apart from each other in the first direction X.

Although not illustrated, the source/drain pattern may be disposed on the second lower pattern BP2 between the first gate electrodes 120. The source/drain pattern on the second lower pattern BP2 may be connected to the end of the second sheet pattern NS2.

A source/drain pattern connected to a first power source/drain contact 170 to be described later may be the first source/drain pattern 150. A source/drain pattern connected to a first source/drain contact 175 to be described later may be the second source/drain pattern 155.

The first source/drain pattern 150 and the second source/drain pattern 155 may include, for example, silicon or germanium, which is an elemental semiconductor material. In addition, the first source/drain pattern 150 and the second source/drain pattern 155 may include, for example, a binary compound or a ternary compound including at least two or more of carbon (C), silicon (Si), germanium (Ge), and tin (Sn), or a compound obtained by doping the binary compound or the ternary compound with a group IV element. For example, the first source/drain pattern 150 and the second source/drain pattern 155 may include, but are not limited to, silicon, silicon-germanium, silicon carbide, or the like.

The first source/drain pattern 150 and the second source/drain pattern 155 may include impurities doped into a semiconductor material. As an example, the first source/drain pattern 150 and the second source/drain pattern 155 include, for example, n-type impurities. The doped impurities may include at least one of phosphorus (P), arsenic (As), antimony (Sb), and bismuth (Bi). As another example, the first source/drain pattern 150 and the second source/drain pattern 155 include, for example, p-type impurities. The doped impurities may include boron (B).

The first interlayer insulating layer 190 may be disposed on the upper surface 100US of the substrate. The first interlayer insulating layer 190 may be disposed on the first source/drain pattern 150 and the second source/drain pattern 155. The first interlayer insulating layer 190 may not cover the upper surface of the first gate capping pattern 145. For example, the upper surface of the first interlayer insulating layer 190 may be on the same plane as the upper surface 145US of the first gate capping pattern.

The first interlayer insulating layer 190 may include, for example, at least one of silicon oxide, silicon nitride, silicon oxynitride, and a low-k material. The low-k material may include, for example, fluorinated tetraethylorthosilicate (FTEOS), hydrogen silsesquioxane (HSQ), bis-benzocyclobutene (BCB), tetramethylorthosilicate (TMOS), octamethylcyclotetrasiloxane (OMCTS), hexamethyldisiloxane (HMDS), trimethylsilyl borate (TMSB), diacetoxyditertiarybutosiloxane (DADBS), trimethylsilyl phosphate (TMSP), polytetrafluoroethylene (PTFE), tonen silazene (TOSZ), fluoride silicate glass (FSG), polyimide nanofoams such as polypropylene oxide, carbon doped silicon oxide (CDO), organo silicate glass (OSG), SiLK, amorphous fluorinated carbon, silica aerogels, silica xerogels, mesoporous silica, or a combination thereof, but is not limited thereto.

A first power source/drain contact 170 may extend to be long in the third direction Z. The first power source/drain contact 170 may be connected to the first source/drain pattern 150. For example, the first power source/drain contact 170 may be electrically connected to the first source/drain pattern 150.

The first power source/drain contact 170 may penetrate through the first source/drain pattern 150, the first lower pattern BP1, and the substrate 100. The first power source/drain contact 170 extends to the lower surface 100BS of the substrate. A portion of the first power source/drain contact 170 may be disposed in the substrate 100.

A first source/drain contact 175 may extend to be long in the third direction Z. The first source/drain contact 175 may be connected to the second source/drain pattern 155. For example, the first source/drain contact 175 may be electrically connected to the second source/drain pattern 155.

The first source/drain contact 175 may penetrate through the second source/drain pattern 155 and the first lower pattern BPL. The first source/drain contact 175 does not penetrate through the substrate 100. The first source/drain contact 175 does not extend to the lower surface 100BS of the substrate. A portion of the first source/drain contact 175 may be disposed in the substrate 100.

A second power source/drain contact 270 and a second source/drain contact 275 may each extend to be long in the third direction Z.

Although not illustrated, each of the second power source/drain contact 270 and the second source/drain contact 275 may be electrically connected to the source/drain pattern on the second lower pattern BP2. The second power source/drain contact 270 and the second source/drain contact 275 may each penetrate through the second lower pattern BP2.

The second power source/drain contact 270 may penetrate through the substrate 100. The second power source/drain contact 270 extends to the lower surface 100BS of the substrate. The second source/drain contact 275 does not penetrate through the substrate 100. The second source/drain contact 275 does not extend to the lower surface 100BS of the substrate. A portion of the second power source/drain contact 270 and a portion of the second source/drain contact 275 are disposed in the substrate 100.

A height h11 from the upper surface 120US of the first gate electrode to an upper surface 170US of the first power source/drain contact may be the same as a height h12 from the upper surface 120US of the first gate electrode to an upper surface 175US of the first source/drain contact. Here, the meaning of "same height" includes not only that the heights are completely the same at two positions being compared, but also includes a slight difference in height that may occur due to a margin or the like in a process.

Based on the upper surface AP1_US of the first active pattern, the height of the upper surface 170US of the first power source/drain contact and the height of the upper surface 175US of the first source/drain contact may be the same as the height of the upper surface 145US of the first gate capping pattern. For example, the upper surface 170US of the first power source/drain contact and the upper surface 175US of the first source/drain contact may be on the same plane as the upper surface 145US of the first gate capping pattern. The upper surface 170US of the first power source/drain contact and the upper surface 175US of the first source/drain contact may be on the same plane as the upper surface of the first interlayer insulating layer 190.

Although it is illustrated in FIG. 2 that a portion of the first interlayer insulating layer 190 is disposed between the first power source/drain contact 170 and the first gate structure GS1 and between the first source/drain contact 175 and the first gate structure GS1, the present disclosure is not limited thereto. Unlike illustrated, the first power source/drain contact 170 and the first source/drain contact 175 may be in contact with a sidewall of the first gate structure GS1.

The first source/drain pattern 150 may be separated into two portions by the first power source/drain contact 170. The second source/drain pattern 155 may be separated into two portions by the first source/drain contact 175.

A first contact silicide layer 151 may be disposed between the first power source/drain contact 170 and the first source/drain pattern 150. A second contact silicide layer 156 may be disposed between the first source/drain contact 175 and the second source/drain pattern 155.

Unlike illustrated, the first source/drain pattern 150 may not be disposed between the first contact silicide layer 151 and the first sheet pattern NS1. In this case, the first contact silicide layer 151 may be in contact with the first end NS1_E1 of the first sheet pattern. In addition, the second source/drain pattern 155 may not be disposed between the second contact silicide layer 156 and the first sheet pattern NS1. In this case, the second contact silicide layer 156 may be in contact with the second end NS1_E2 of the first sheet pattern.

Although each of the first power source/drain contact 170, the first source/drain contact 175, the second power source/drain contact 270, and the second source/drain contact 275 is illustrated as a single layer, it is only for convenience of explanation and the present disclosure is not limited thereto. Each of the first power source/drain contact 170, the first source/drain contact 175, the second power source/drain contact 270, and the second source/drain contact 275 may include, for example, at least one of a metal, a metal alloy, conductive metal nitride, a conductive metal carbide, conductive metal oxide, conductive metal carbonitride, and a two-dimensional (2D) material.

The first contact silicide layer 151 and the second contact silicide layer 156 may include metal silicide.

A contact insulating liner 171 may be disposed on a sidewall of the first power source/drain contact 170, a sidewall of the first source/drain contact 175, a sidewall of the second power source/drain contact 270, and a sidewall of the second source/drain contact 275. When the first power source/drain contact 170 is described as an example, the contact insulating liner 171 may extend along a portion of the sidewall of the first power source/drain contact 170. The contact insulating liner 171 may be disposed between the first power source/drain contact 170 and the first lower pattern BP1 and between the first power source/drain contact 170 and the substrate 100.

The contact insulating liner 171 may be made of an insulating material. The contact insulating liner 171 may include, for example, at least one of silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), and a low-k material, but is not limited thereto.

A first contact blocking pattern 180 may be disposed in the substrate 100. The first contact blocking pattern 180 may fill a blocking trench 180*t* formed in the substrate 100.

The first contact blocking pattern 180 may include an upper surface 180US and a lower surface 180BS that are opposite each other in the third direction Z. The upper surface 180US of the first contact blocking pattern faces the second source/drain pattern 155. The substrate 100 does not cover the lower surface 180BS of the first contact blocking pattern.

The first contact blocking pattern 180 may be disposed on a lower side of the second source/drain pattern 155. For example, in FIG. 2, the first contact blocking pattern 180 may be under and to the side of the second source/drain pattern 155. The first source/drain contact 175 and the second source/drain contact 175 are disposed on the first contact blocking pattern 180.

The first source/drain contact 175 and the second source/drain contact 275 may be in contact with the first contact blocking pattern 180. For example, the first source/drain contact 175 and the second source/drain contact 275 may be in contact with the upper surface 180US of the first contact blocking pattern.

The first power source/drain contact 170 and the second power source/drain contact 270 are not in contact with the upper surface 180US of the first contact blocking pattern.

The first contact blocking pattern 180 may be made of an insulating material. The first contact blocking pattern 180 may include, for example, at least one of silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), and a low-k material, but is not limited thereto. Although the first contact blocking pattern 180 is illustrated as a single layer, it is only for convenience of explanation and the present disclosure is not limited thereto.

A depth d11 from the upper surface 120US of the first gate electrode to the lowermost portion of the first power source/drain contact 170 may be greater than a depth d21 from the upper surface 120US of the first gate electrode to the lowermost portion of the first source/drain pattern 150. A depth d12 from the upper surface 120US of the first gate electrode to the lowermost portion of the first source/drain contact 175 may be greater than a depth d22 from the upper surface 120US of the first gate electrode to the lowermost portion of the second source/drain pattern 155. The depth d12 from the upper surface 120US of the first gate electrode to the lowermost portion of the first source/drain contact 175 may be the same as a depth from the upper surface 120US of the first gate electrode to the upper surface 180US of the first contact blocking pattern.

The depth d11 from the upper surface 120US of the first gate electrode to the lowermost portion of the first power source/drain contact 170 may be greater than the depth d12 from the upper surface 120US of the first gate electrode to the upper surface 180US of the first contact blocking pattern. The depth d11 from the upper surface 120US of the first gate electrode to the lowermost portion of the first power source/drain contact 170 may be the same as a depth from the upper surface 120US of the first gate electrode to the lower surface 180BS of the first contact blocking pattern.

A height (d11+h11) of the first power source/drain contact 170 in the third direction Z may be greater than a height (d12+h12) of the first source/drain contact 175 in the third direction Z.

A first power line 50 and a second power line 60 may be disposed on the lower surface 100BS of the substrate. For example, each of the first power line 50 and the second power line 60 may extend in the first direction X, but is not limited thereto.

The first power line 50 may be spaced apart from the second power line 60 in the second direction Y. The first power line 50 and the second power line 60 may be alternately disposed on the lower surface 100BS of the substrate.

The first power line 50 may be connected to the first power source/drain contact 170. The second power line 60 may be connected to the second power source/drain contact 270. A voltage applied to the first power line 50 may be different from a voltage applied to the second power line 60.

The first contact blocking pattern 180 may be disposed between the first power line 50 and the first source/drain contact 175 and between the second power line 60 and the second source/drain contact 275. The first contact blocking pattern 180 may electrically insulate the source/drain contacts 175 and 275 from the power lines 50 and 60. The first power line 50 is not connected to the first source/drain contact 175. The second power line 60 is not connected to the second source/drain contact 275.

The first contact blocking pattern 180 is not disposed between the first power line 50 and the first power source/drain contact 170 and between the second power line 60 and the second power source/drain contact 270.

Each of the first power line 50 and the second power line 60 may include, for example, at least one of a metal, a metal alloy, conductive metal nitride, conductive metal carbide, conductive metal oxide, conductive metal carbonitride, and a two-dimensional (2D) material.

A second interlayer insulating layer 191 may be disposed on the first interlayer insulating layer 190, the first gate structure GS1, the first power source/drain contact 170, and the first source/drain contact 175.

The second interlayer insulating layer 191 may include, for example, at least one of silicon oxide, silicon nitride, silicon carbonitride, silicon oxynitride, and a low-k material.

A wiring structure 195 may be disposed in the second interlayer insulating layer 191. The wiring structure 195 may be disposed on the upper surface 100US of the substrate.

The wiring structure 195 may include a via plug 196 and a wiring line 197. As an example, the wiring structure 195 may be connected to the first source/drain contact 175. The wiring structure 195 is not connected to the first power source/drain contact 170. Unlike illustrated, as another example, the wiring structure 195 may be connected to the first power source/drain contact 170 and the first source/drain contact 175.

Each of the via plug 196 and the wiring line 197 may include, for example, at least one of a metal, a metal alloy, conductive metal nitride, conductive metal carbide, conductive metal oxide, conductive metal carbonitride, and a two-dimensional material.

Although each of the via plug 196 and the wiring line 197 is illustrated as a single layer, it is only for convenience of explanation and the present disclosure is not limited thereto. Unlike illustrated, the via plug 196 and the wiring line 197 may have an integral structure.

Figure 7:
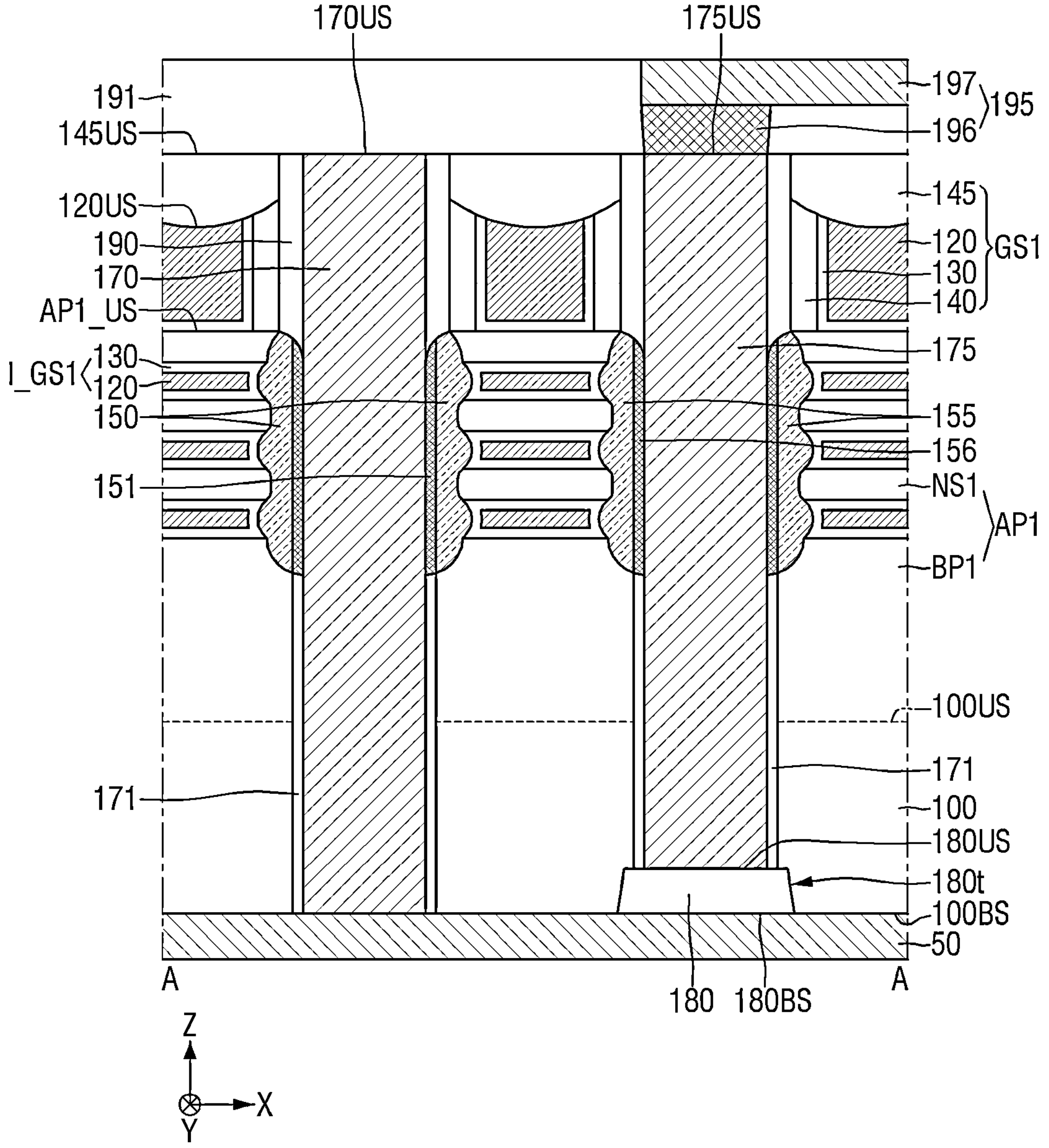
FIG. 7 is a view for describing a semiconductor device according to some embodiments.
Figure 8:
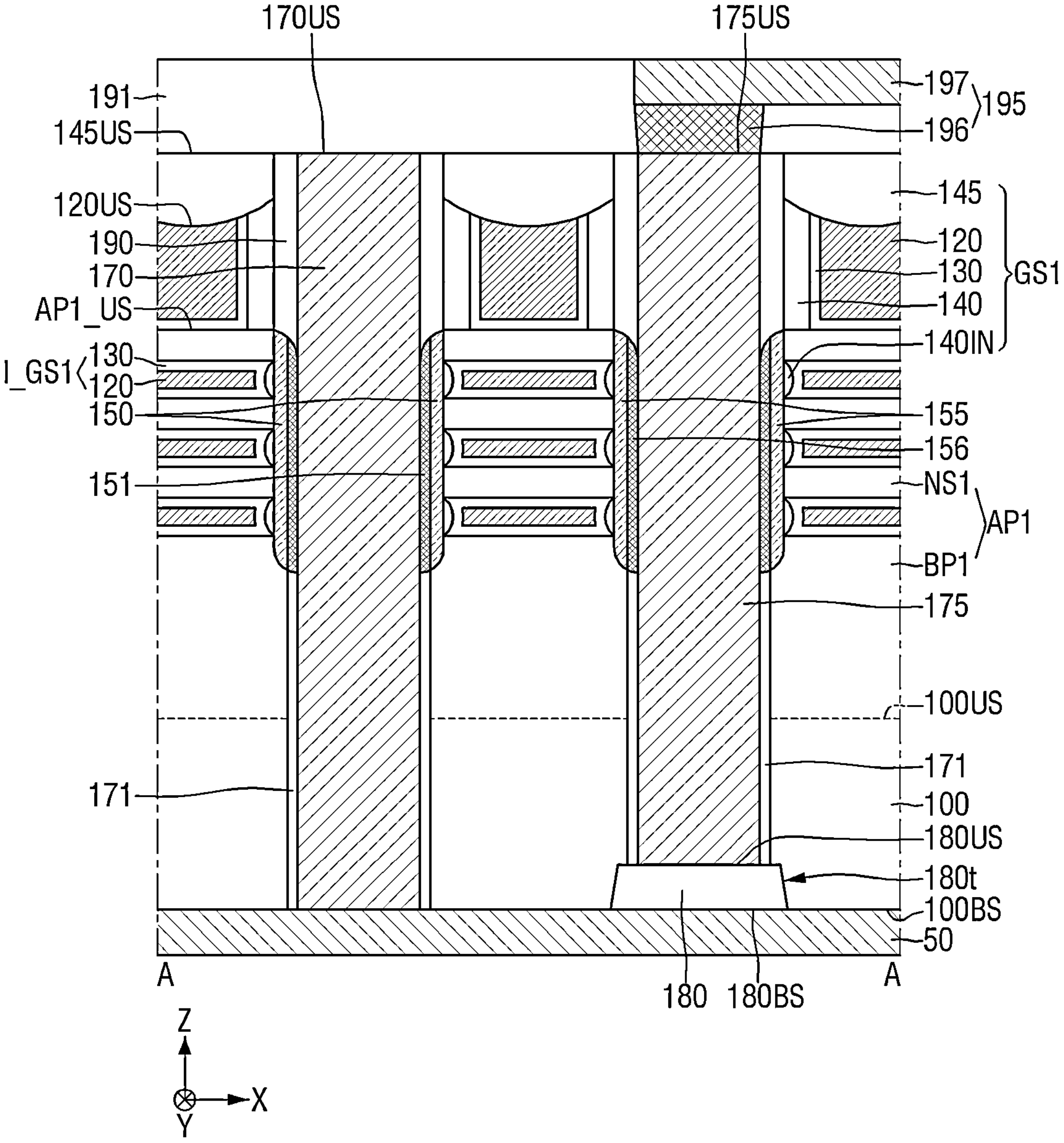
FIG. 8 is a view for describing a semiconductor device according to some embodiments.

FIG. 7 is a view for describing a semiconductor device according to some embodiments. FIG. 8 is a view for describing a semiconductor device according to some embodiments. For convenience of explanation, points different from those described with reference to FIGS. 1 to 6 will be mainly described.

Referring to FIG. 7, in the semiconductor device according to some embodiments, the first source/drain pattern 150 and the second source/drain pattern 155 may include outer sidewalls in contact with the first sheet pattern NS1 and the first inner gate structure I_GS1.

The outer sidewall of the first source/drain pattern 150 and the outer sidewall of the second source/drain pattern 155 may have a wavy shape.

Referring to FIG. 8, in the semiconductor device according to some embodiments, the first gate structure GS1 may further include a plurality of first inner spacers 140_IN.

The first inner spacer 140_IN may be disposed between the first sheet patterns NS1 adjacent to each other in the third direction Z and between the first lower pattern BP1 and the first sheet pattern NS1. The first inner spacer 140_IN may be disposed between the first inner gate structure I_GS1 and the first source/drain pattern 150. The first inner spacer 140_IN may be disposed between the first inner gate structure I_GS1 and the second source/drain pattern 155.

The first inner gate structure I_GS1 may not be in contact with the first source/drain pattern 150. The first inner gate structure I_GS1 may not be in contact with the second source/drain pattern 155.

Figure 9:
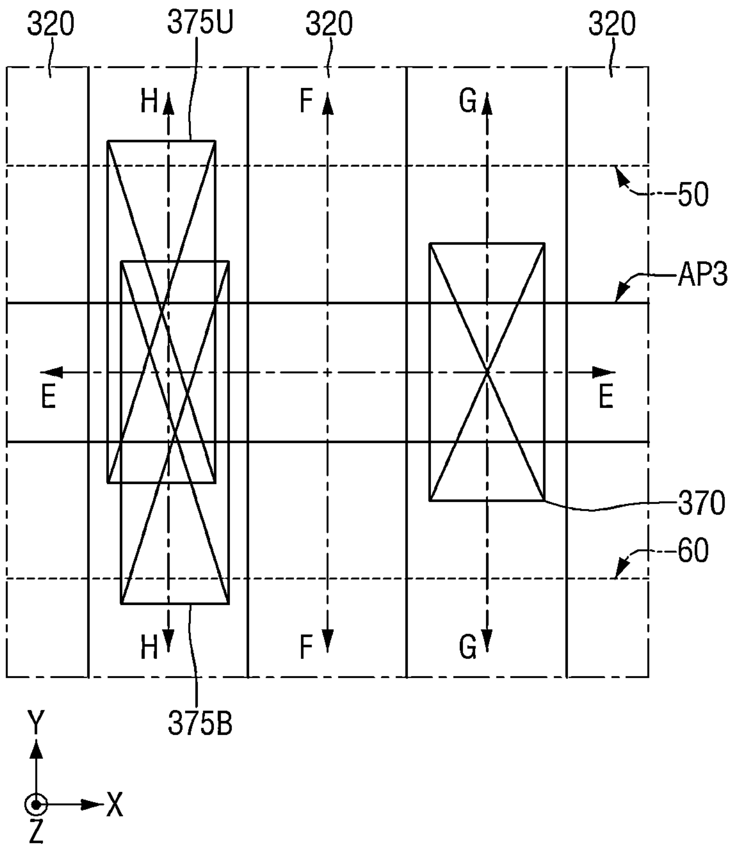
FIG. 9 is a layout view for describing a semiconductor device according to some embodiments.
Figure 14:
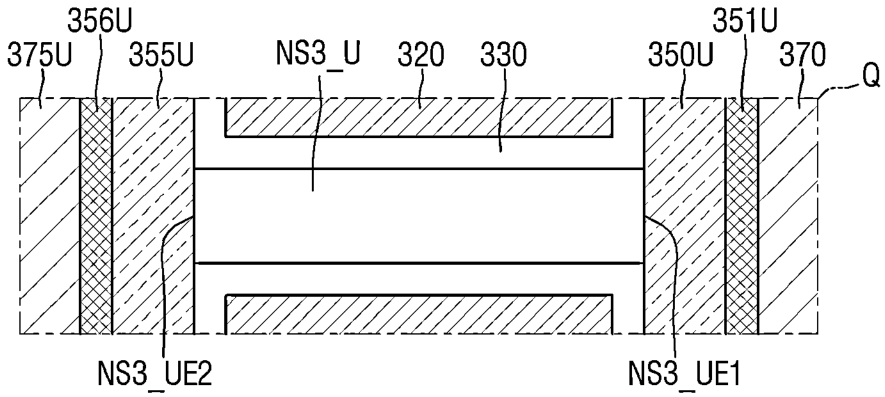
FIGS. 14 and 15 are enlarged views of portion Q and portion R of FIG. 10.
Figure 15:
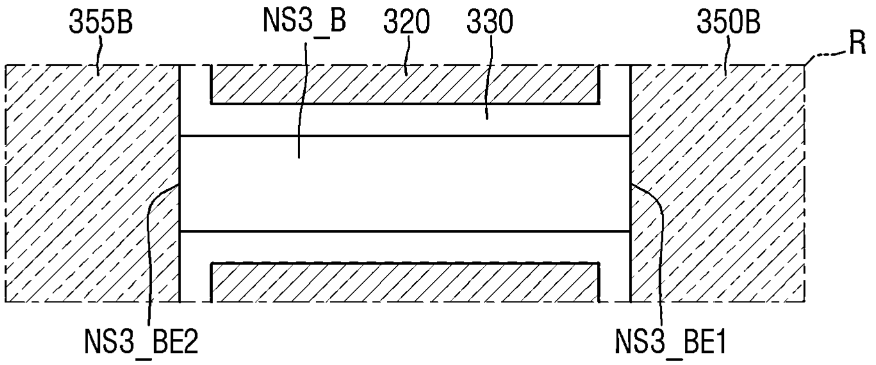

FIG. 9 is a layout view for describing a semiconductor device according to some embodiments. FIGS. 10 to 13 are cross-sectional views taken along lines E-E, F-F, G-G, and H-H of FIG. 9. FIGS. 14 and 15 are enlarged views of portion Q and portion R of FIG. 10. For convenience of explanation, a wiring structure 195 is not illustrated in FIG. 9.

Referring to FIGS. 9 to 15, a semiconductor device according to some embodiments may include a third active pattern AP3, a plurality of second gate electrodes 320, a third lower source/drain pattern 350B, a third upper source/drain pattern 350U, a fourth lower source/drain pattern 355B, a fourth upper source/drain pattern 355U, a connection source/drain contact 370, a third lower source/drain contact 375B, a third upper source/drain contact 375U, and a second contact blocking pattern 380.

The third active pattern AP3 may be disposed on the upper surface 100US of the substrate. The third active pattern AP3 may include a third lower pattern BP3, a third lower sheet pattern NS3_B, and a third upper sheet pattern NS3_U.

The third lower pattern BP3 may protrude from the upper surface 100US of the substrate. The third lower pattern BP3 may extend along the first direction X.

The third lower sheet pattern NS3_B and the third upper sheet pattern NS3_U may be disposed on the upper surface 100US of the substrate. The third lower sheet pattern NS3_B may be disposed on the third lower pattern BP3. The third lower sheet pattern NS3_B may be disposed to be spaced apart from the third lower pattern BP3 in the third direction Z. The third upper sheet pattern NS3_U may be disposed on the third lower sheet pattern NS3_B. The third upper sheet pattern NS3_U may be disposed to be spaced apart from the third lower sheet pattern NS3_B in the third direction Z. The third lower sheet pattern NS3_B may be disposed between the substrate 100 and the third upper sheet pattern NS3_U.

Although it is illustrated that two third lower sheet patterns NS3_B and two third upper sheet patterns NS3_U are disposed in the third direction Z, respectively, it is only for convenience of explanation and the present disclosure is not limited thereto. An upper surface of the third active pattern AP3 may be an upper surface of a third upper sheet pattern NS3_U disposed on the uppermost portion among the third upper sheet patterns NS3_U.

In FIG. 14, the third upper sheet pattern NS3_U may include a first end NS1_UE1 and a second end NS1_UE2. The first end NS3_UE1 of the third upper sheet pattern is spaced apart from the second end NS3_UE2 of the third upper sheet pattern in the first direction X. The first end NS3_UE1 of the third upper sheet pattern and the second end NS3_UE2 of the third upper sheet pattern may be portions connected to upper source/drain patterns 350U and 355U to be described later, respectively.

In FIG. 15, the third lower sheet pattern NS3_B may include a first end NS1_BE1 and a second end NS1_BE2. The first end NS3_BE1 of the third lower sheet pattern is spaced apart from the second end NS3_BE2 of the third lower sheet pattern in the first direction X. The first end NS3_BE1 of the third lower sheet pattern and the second end NS3_BE2 of the third lower sheet pattern may be portions connected to lower source/drain patterns 350B and 355B to be described later, respectively.

Each of the third lower pattern BP3, the third lower sheet pattern NS3_B, and the third upper sheet pattern NS3_U may include one of silicon or germanium, which is an elemental semiconductor material, a group IV-IV compound semiconductor, or a group III-V compound semiconductor. The third lower sheet pattern NS3_B and the third upper sheet pattern NS3_U may include the same material or different materials.

As an example, one of the third lower sheet pattern NS3_B and the third upper sheet pattern NS3_U may be a channel region of a PMOS, and the other thereof may be a channel region of an NMOS. As another example, the third lower sheet pattern NS3_B and the third upper sheet pattern NS3_U may be channel regions of a PMOS. As still another example, the third lower sheet pattern NS3_B and the third upper sheet pattern NS3_U may be channel regions of an NMOS. Hereinafter, it will be described that one of the third lower sheet pattern NS3_B and the third upper sheet pattern NS3_U may be a channel region of a PMOS and the other thereof may be a channel region of an NMOS.

A dummy sheet pattern 320_IP may be disposed between the third lower sheet pattern NS3_B and the third upper sheet pattern NS3_U. The third upper sheet pattern NS3_U may be disposed on the dummy sheet pattern 320_IP. The third lower sheet pattern NS3_B may be disposed between the dummy sheet pattern 320_IP and the third lower pattern BP3.

The dummy sheet pattern 320_IP may include an insulating material. The dummy sheet pattern 320_IP may include, for example, at least one of silicon nitride (SiN), silicon oxynitride (SiON), silicon carbonitride (SiCN), and silicon oxycarbonitride (SiOCN), but is limited thereto.

Unlike illustrated, the dummy sheet pattern may not be disposed between the third lower sheet pattern NS3_B and the third upper sheet pattern NS3_U.

The field insulating layer 105 may cover a sidewall of the third lower pattern BP3. The field insulating layer 105 does not cover an upper surface of the third lower pattern BP3.

A plurality of second gate structures GS2 may be disposed on the upper surface 100US of the substrate. Each of the second gate structures GS2 may extend in the second direction Y. The second gate structures GS2 may be disposed to be spaced apart from each other in the first direction X.

The second gate structure GS2 may be disposed on the third active pattern AP3. The second gate structure GS2 may intersect the third active pattern AP3. The second gate structure GS2 may intersect the third lower pattern BP3. The second gate structure GS2 may surround the third lower sheet pattern NS3_B, the third upper sheet pattern NS3_U, and the dummy sheet pattern 320_IP.

The second gate structure GS2 may include, for example, a second gate electrode 320, a second gate insulating layer 330, a second gate spacer 340, and a second gate capping pattern 345.

The second gate structure GS2 may include a plurality of second inner gate structures I_GS2 disposed between the third lower sheet patterns NS3_B adjacent to each other in the third direction Z and between the third lower pattern BP3 and the third lower sheet pattern NS3_B. The second inner gate structure I_GS2 may be disposed between the third lower sheet pattern NS3_B and the dummy sheet pattern 320_IP, between the third upper sheet pattern NS3_U and the dummy sheet pattern 320_IP, and between the third upper sheet patterns NS3_U adjacent to each other in the third direction Z. The second inner gate structure I_GS2 may include the second gate electrode 320 and the second gate insulating layer 330.

The second gate electrode 320 may be disposed on the third lower pattern BP3. The second gate electrode 320 may intersect the third lower pattern BP3. The second gate electrode 320 may surround the third lower sheet pattern NS3_B, the third upper sheet pattern NS3_U, and the dummy sheet pattern 320_IP.

The second gate insulating layer 330 may extend along the upper surface of the field insulating layer 105 and the upper surface of the third lower pattern BP3. The second gate insulating layer 330 may surround the third lower sheet pattern NS3_B, the third upper sheet pattern NS3_U, and the dummy sheet pattern 320_IP. The second gate insulating layer 330 may be disposed between the second gate electrode 320 and the third lower sheet pattern NS3_B, between the second gate electrode 320 and the third upper sheet pattern NS3_U, and between the second gate electrode 320 and the dummy sheet pattern 320_IP.

The second gate spacer 340 may be disposed on a sidewall of the second gate electrode 320. The second gate capping pattern 345 may be disposed on the second gate electrode 320.

The second gate spacer 340 may not be disposed between the third lower pattern BP3 and the third lower sheet pattern NS3_B and between the third lower sheet patterns NS3_B adjacent to each other in the third direction Z. The second gate spacer 340 may not be disposed between the dummy sheet pattern 320_IP and the third upper sheet pattern NS3_U and between the third upper sheet patterns NS3_U adjacent to each other in the third direction Z.

Unlike illustrated, as an example, the second gate structure GS2 may further include an inner spacer disposed between the third lower pattern BP3 and the third lower sheet pattern NS3_B and between the third lower sheet patterns NS3_B adjacent to each other in the third direction Z. As another example, the second gate structure GS2 may further include an inner spacer disposed between the dummy sheet pattern 320_IP and the third upper sheet pattern NS3_U and between the third upper sheet patterns NS3_U adjacent to each other in the third direction Z.

The third lower source/drain pattern 350B and the fourth lower source/drain pattern 355B may be disposed on the third lower pattern BP3. The third lower source/drain pattern 350B and the fourth lower source/drain pattern 355B may be in contact with the third lower sheet pattern NS3_B.

The third lower source/drain pattern 350B may be connected to the first end NS3_BE1 of the third lower sheet pattern. The third lower source/drain pattern 350B may be disposed between the substrate 100 and the third upper source/drain pattern 350U.

The fourth lower source/drain pattern 355B may be connected to the second end NS3_BE2 of the third lower sheet pattern. The fourth lower source/drain pattern 355B may be disposed between the substrate 100 and a fourth upper source/drain pattern 355U.

The third upper source/drain pattern 350U and the fourth upper source/drain pattern 355U may be disposed on the third lower source/drain pattern 350B and the fourth lower source/drain pattern 355B. The third upper source/drain pattern 350U and the fourth upper source/drain pattern 355U may be in contact with the third upper sheet pattern NS3_U.

The third upper source/drain pattern 350U may be connected to the first end NS3_UE1 of the third upper sheet pattern. The fourth upper source/drain pattern 355U may be connected to the second end NS3_UE2 of the third upper sheet pattern.

The third upper source/drain pattern 350U and the fourth upper source/drain pattern 355U may include a first portion and a second portion separated from each other in the first direction X.

A source/drain separation structure 350_SP may be disposed between the third upper source/drain pattern 350U and the third lower source/drain pattern 350B. The third upper source/drain pattern 350U may be disposed on the source/drain separation structure 350_SP. The source/drain separation structure 350_SP may be in contact with the third lower source/drain pattern 350B and the third upper source/drain pattern 350U.

The second contact blocking pattern 380 may be disposed between the fourth upper source/drain pattern 355U and the fourth lower source/drain pattern 355B. The second contact blocking pattern 380 may include an upper surface 380US and a lower surface 380BS that are opposite each other in the third direction Z. The upper surface 380US of the second contact blocking pattern faces the fourth upper source/drain pattern 355U.

The fourth upper source/drain pattern 355U may be disposed on the upper surface 380US of the second contact blocking pattern. The fourth upper source/drain pattern 355U may be in contact with the upper surface 380US of the second contact blocking pattern. The fourth lower source/drain pattern 355B may be disposed between the second contact blocking pattern 380 and the substrate 100.

Each of the source/drain separation structure 350_SP and the second contact blocking pattern 380 may be made of an insulating material. The source/drain separation structure 350_SP may include a material different from that of the second contact blocking pattern 380. The second contact blocking pattern 380 may include a material having an etch selectivity with respect to the source/drain separation structure 350_SP.

The connection source/drain contact 370 may extend to be long in the third direction Z. The connection source/drain contact 370 may pass through the third upper source/drain pattern 350U and extend to the third lower source/drain pattern 350B.

The connection source/drain contact 370 may be connected to the third upper source/drain pattern 350U and the third lower source/drain pattern 350B. For example, the connection source/drain contact 370 may be electrically connected to the third upper source/drain pattern 350U and the third lower source/drain pattern 350B.

The connection source/drain contact 370 may penetrate through the third upper source/drain pattern 350U and the source/drain separation structure 350_SP. The connection source/drain contact 370 does not penetrate through the third lower source/drain pattern 350B. The connection source/drain contact 370 does not include a portion disposed in the substrate 100.

The third lower source/drain contact 375B may be disposed on the fourth lower source/drain pattern 355B. The third lower source/drain contact 375B may be connected to the fourth lower source/drain pattern 355B. For example, the second contact blocking pattern 380 may be disposed on the third lower source/drain contact 375B. The third lower source/drain contact 375B may be electrically insulated from the fourth upper source/drain pattern 355U by the second contact blocking pattern 380.

The third upper source/drain contact 375U may extend to be long in the third direction Z. The third upper source/drain contact 375U may penetrate through the fourth upper source/drain pattern 355U. The third upper source/drain contact 375U may be connected to the fourth upper source/drain pattern 355U. For example, the third upper source/drain contact 375U may be electrically connected to the fourth upper source/drain pattern 355U.

The third upper source/drain contact 375U may extend to the second contact blocking pattern 380. The third upper source/drain contact 375U may be in contact with the second contact blocking pattern 380.

The third upper source/drain contact 375U does not extend to the fourth lower source/drain pattern 355B. The third upper source/drain contact 375U is not connected to the fourth lower source/drain pattern 355B. The third upper source/drain contact 375U does not include a portion disposed in the substrate 100.

The third upper source/drain pattern 350U may be separated into two portions by the connection source/drain contact 370. The fourth upper source/drain pattern 355U may be separated into two portions by the third upper source/drain contact 375U.

A third lower contact silicide layer 351B may be disposed between the connection source/drain contact 370 and the third lower source/drain pattern 350B. A third upper contact silicide layer 351U may be disposed between the connection source/drain contact 370 and the third upper source/drain pattern 350U. A fourth lower contact silicide layer 356B may be disposed between the fourth lower source/drain contact 375B and the fourth lower source/drain pattern 355B. A fourth upper contact silicide layer 356U may be disposed between the fourth upper source/drain contact 375U and the fourth upper source/drain pattern 355U.

Although each of the connection source/drain contact 370, the fourth lower source/drain contact 375B, and the fourth upper source/drain contact 375U is illustrated as a single layer, it is only for convenience of explanation, and the present disclosure is not limited thereto. Each of the connection source/drain contact 370, the fourth lower source/drain contact 375B, and the fourth upper source/drain contact 375U may include, for example, at least one of a metal, a metal alloy, conductive metal nitride, conductive metal carbide, conductive metal oxide, conductive metal carbonitride, and a two-dimensional (2D) material.

A depth d13 from an upper surface 320US of the second gate electrode to the lowermost portion of the connection source/drain contact 370 may be greater than a depth d23 from the upper surface 320US of the second gate electrode to the lowermost portion of the third upper source/drain pattern 350U. A depth d14 from the upper surface 320US of the second gate electrode to the lowermost portion of the fourth upper source/drain contact 375U may be the same as a depth d24 from the upper surface 320US of the second gate electrode to the lowermost portion of the fourth upper source/drain pattern 355U.

The depth d13 from the upper surface 320US of the second gate electrode to the lowermost portion of the connection source/drain contact 370 may be greater than the depth d14 from the upper surface 320US of the second gate electrode to the lowermost portion of the fourth upper source/drain contact 375U. The depth d13 from the upper surface 320US of the second gate electrode to the lowermost portion of the connection source/drain contact 370 may be smaller than a depth from the upper surface 320US of the second gate electrode to the lowermost portion of the third lower source/drain pattern 350B.

Figure 10:
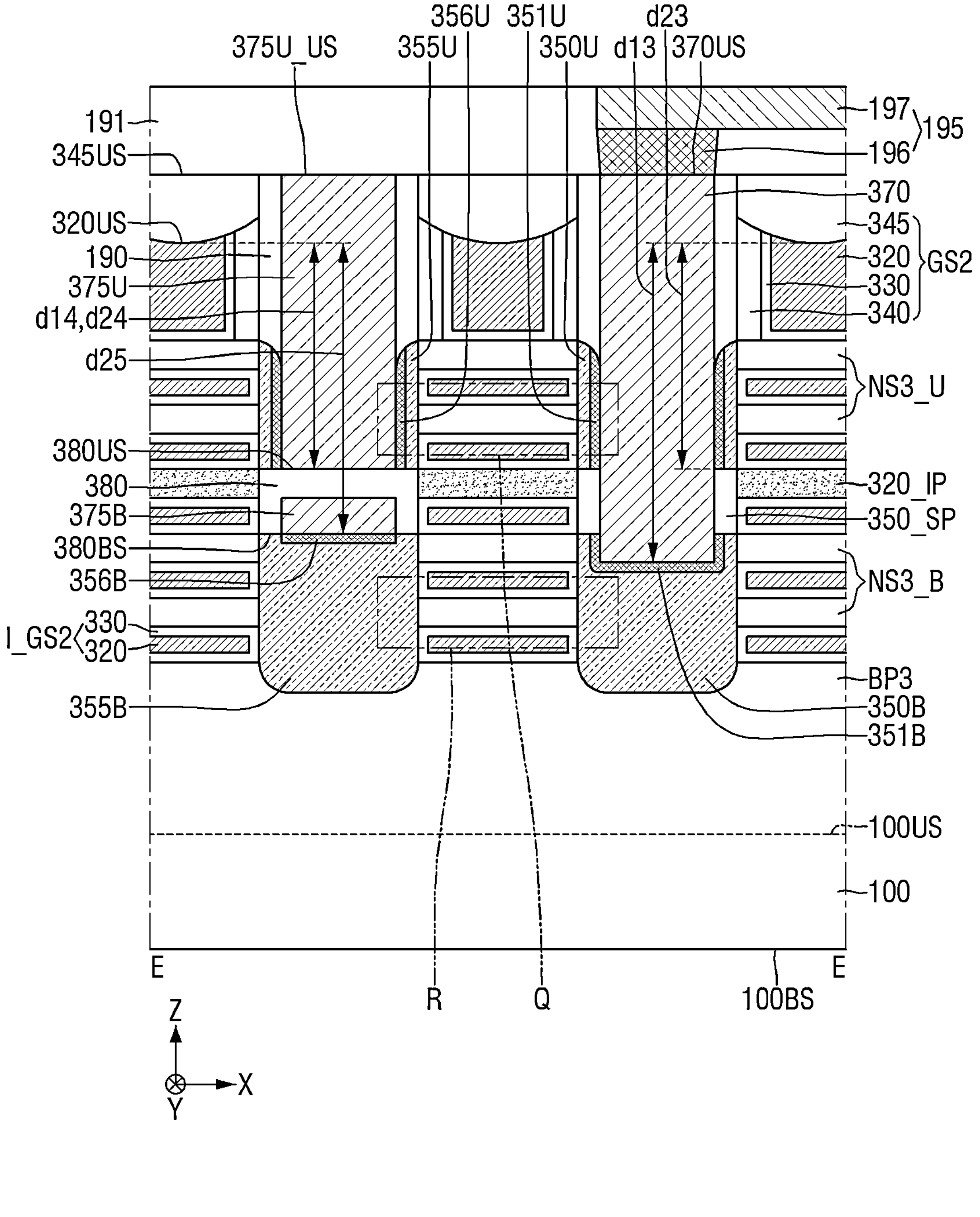
FIGS. 10 to 13 are cross-sectional views taken along lines E-E, F-F, G-G, and H-H of FIG. 9.
Figure 11:
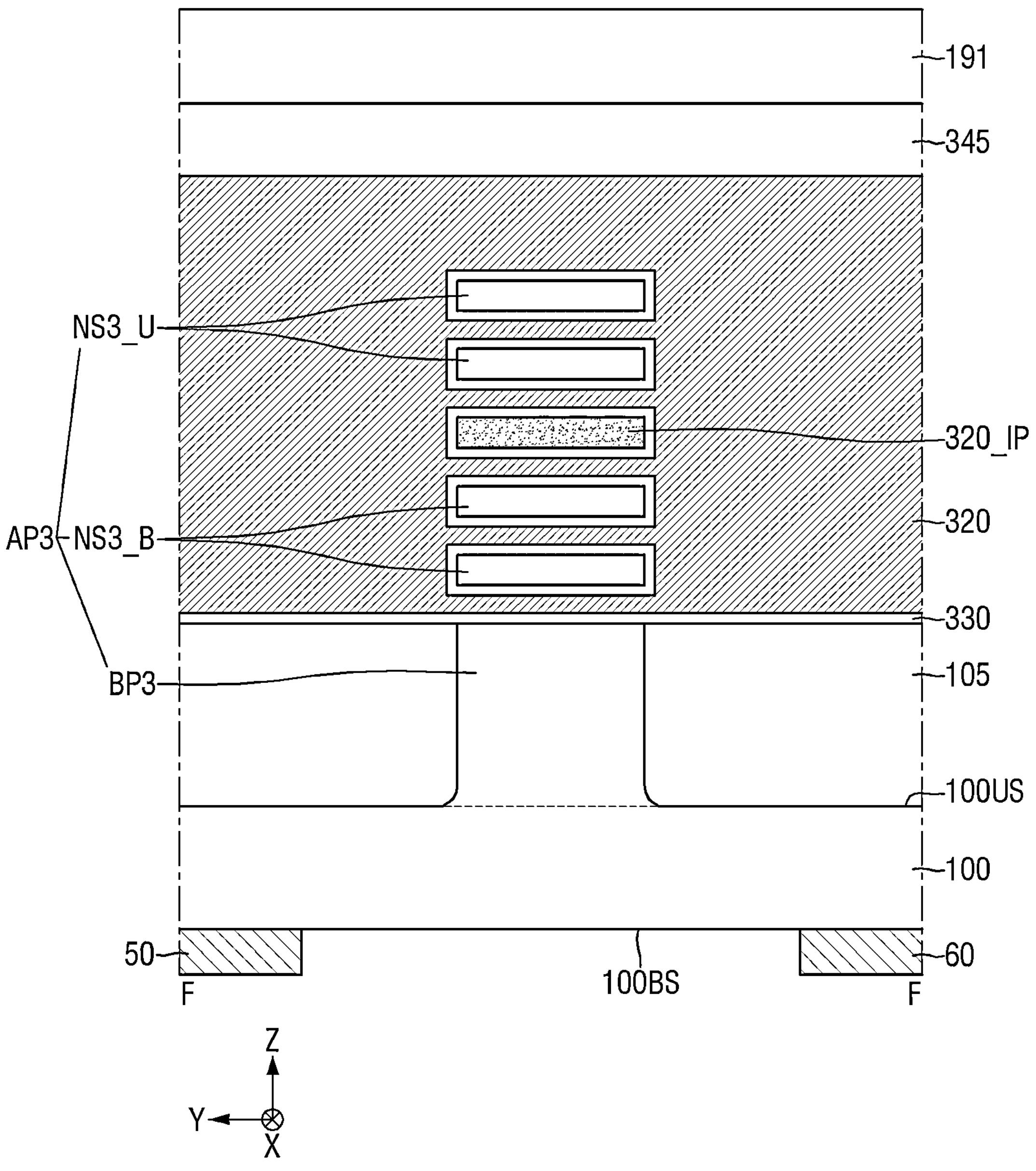
Figure 12:
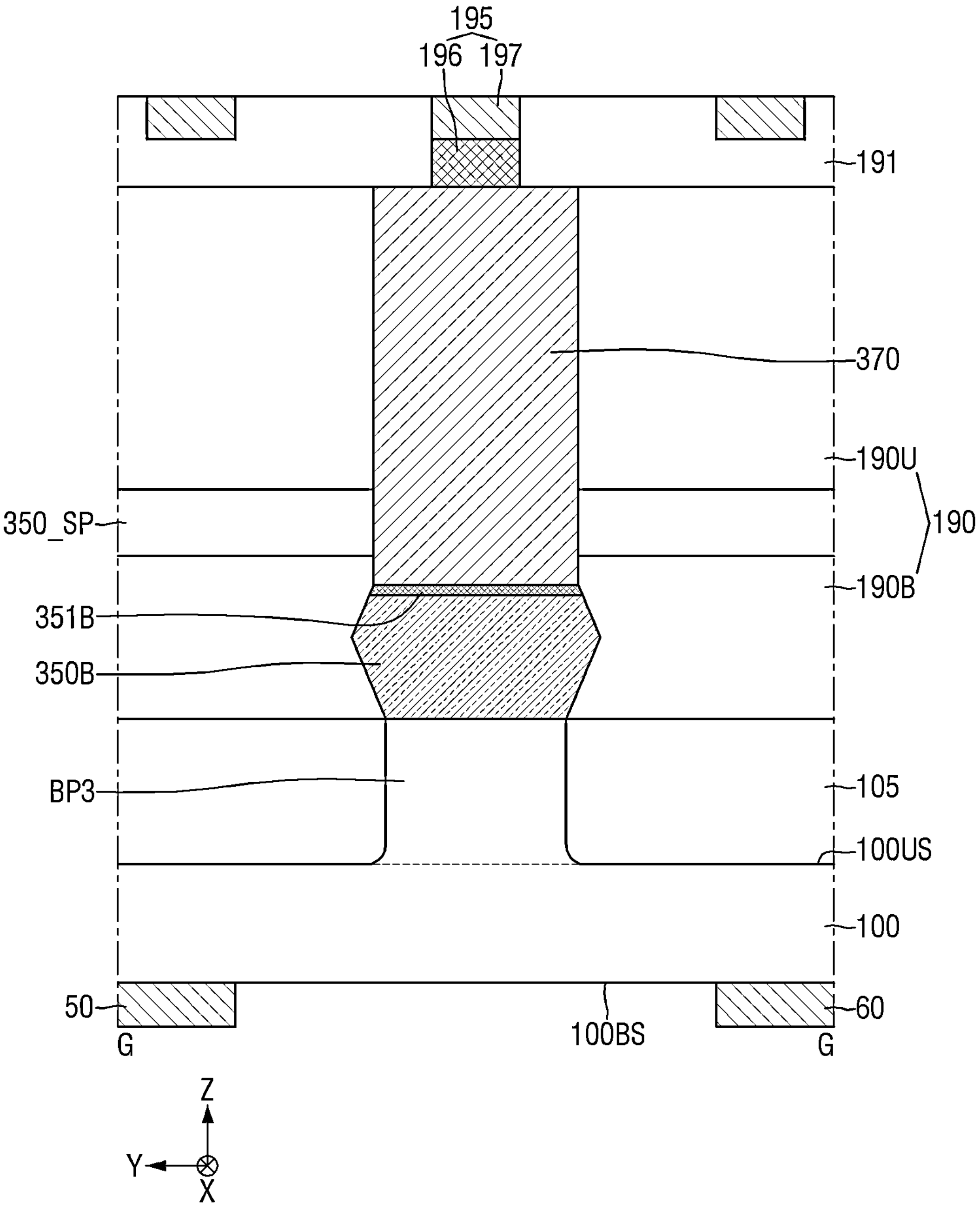
Figure 13:
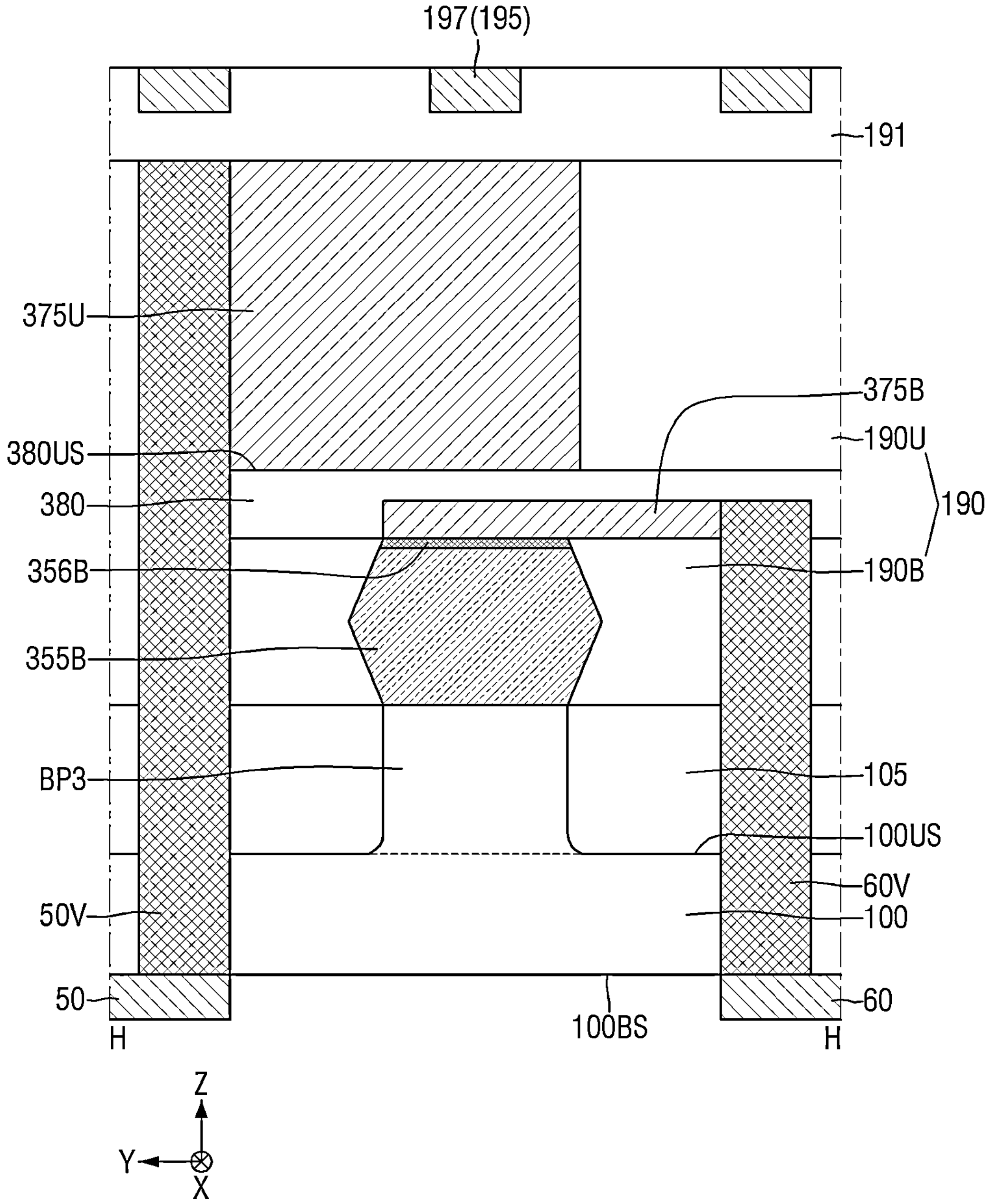

The depth d13 from the upper surface 320US of the second gate electrode to the lowermost portion of the connection source/drain contact 370 may be greater than a depth d25 from the upper surface 320US of the second gate electrode to the lower surface 380BS of the second contact blocking pattern. In the cross-sectional view as illustrated in FIG. 10, a width of the fourth lower source/drain contact 375B in the first direction X may be the same as a width of the upper surface of the fourth lower source/drain pattern 355B. In this case, a boundary line between the fourth lower contact silicide layer 356B and the fourth lower source/drain contact 375B may be defined as the lower surface 380BS of the second contact blocking pattern.

Based on the upper surface 320US of the second gate electrode, a height of an upper surface 370US of the connection source/drain contact and a height of an upper surface 375U_US of the fourth upper source/drain contact may be the same as a height of an upper surface 345US of the second gate capping pattern. For example, the upper surface 370US of the connection source/drain contact and the upper surface 375U_US of the fourth upper source/drain contact may be on the same plane as the upper surface 345US of the second gate capping pattern.

The first interlayer insulating layer 190 may include a first lower interlayer insulating layer 190B and a first upper interlayer insulating layer 190U. The first lower interlayer insulating layer 190B may be disposed around the third lower source/drain pattern 350B and the fourth lower source/drain pattern 355B. The first upper interlayer insulating layer 190U may be disposed around the connection source/drain contact 370 and the fourth upper source/drain contact 375U.

The connection source/drain contact 370 may be connected to the wiring structure 195. The connection source/drain contact 370 may not be connected to the first power line 50 and the second power line 60.

The fourth upper source/drain contact 375U may be connected to the first power line 50 through a first power via 50V. The fourth lower source/drain contact 375B may be connected to the second power line 60 through a second power via 60V. The first power via 50V and the second power via 60V penetrate through the substrate 100. The first power via 50V and the second power via 60V include a conductive material. Although not illustrated, an insulating liner may be further disposed between the power vias 50V and 60V and the substrate 100.

Unlike illustrated, at least one of the fourth lower source/drain contact 375B and the fourth upper source/drain contact 375U may not be connected to the power lines 50 and 60. At least one of the fourth lower source/drain contact 375B and the fourth upper source/drain contact 375U may be connected to the wiring structure 195.

Figure 16:
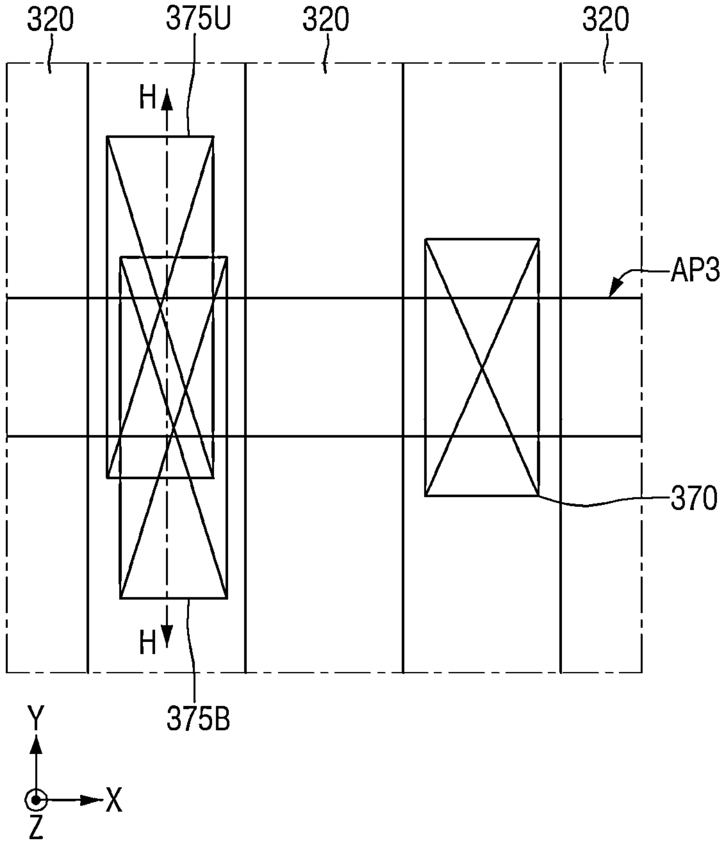
FIG. 16 is a layout view for describing a semiconductor device according to some embodiments.
Figure 17:
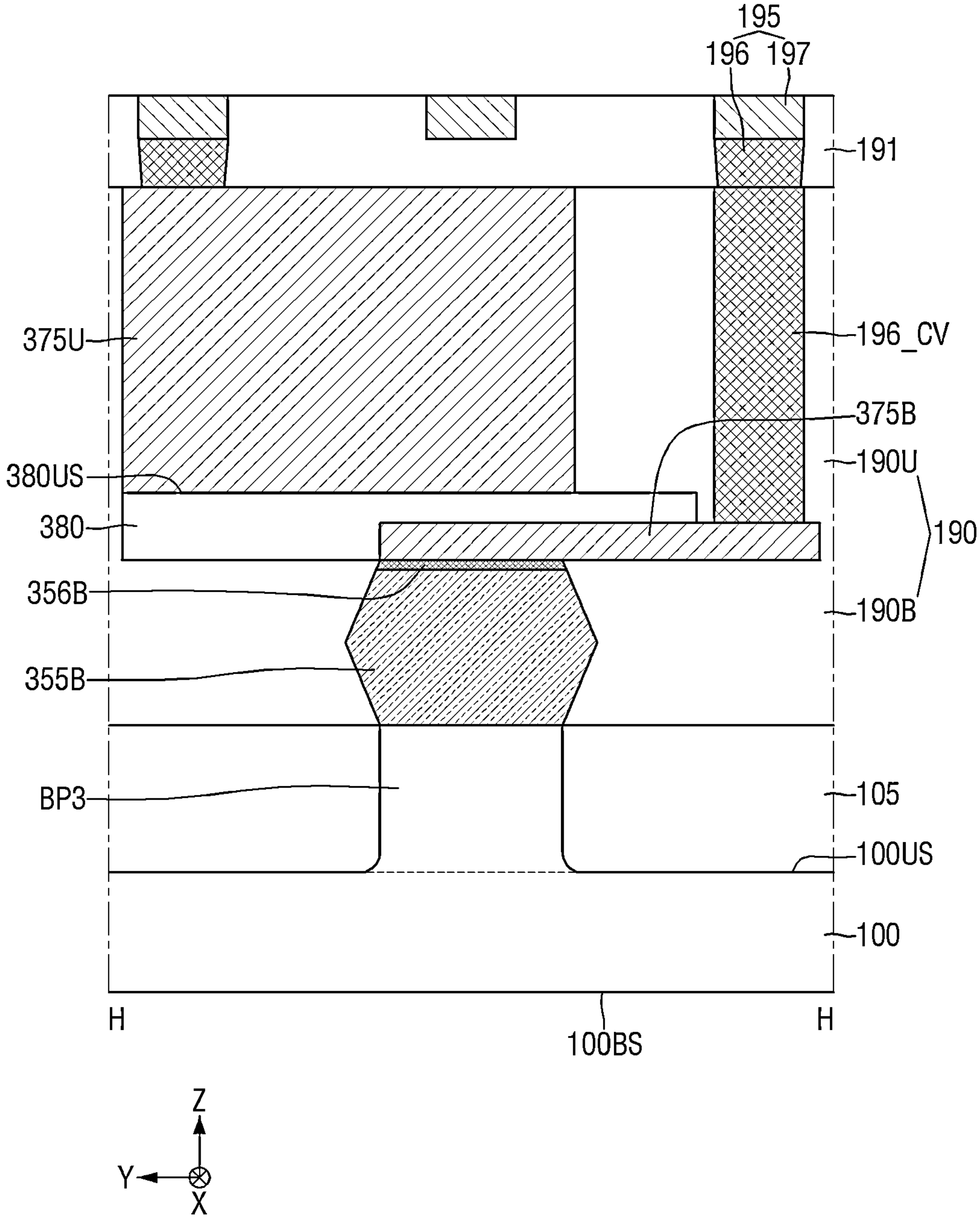
FIG. 17 is a cross-sectional view taken along line H-H of FIG. 16.

FIG. 16 is a layout view for describing a semiconductor device according to some embodiments. FIG. 17 is a cross-sectional view taken along line H-H of FIG. 16. For convenience of explanation, points different from those described with reference to FIGS. 10 to 15 will be mainly described.

Referring to FIGS. 16 and 17, the semiconductor device according to some embodiments does not include a power line disposed on the lower surface 100BS of the substrate.

The fourth lower source/drain contact 375B may be connected to the wiring structure 195 through a connection via 196_CV. The fourth upper source/drain contact 375U may be connected to the wiring structure 195.

FIGS. 18 to 23 are intermediate operation views for describing a method for manufacturing a semiconductor device according to some embodiments. For reference, FIGS. 18 to 23 may be a method for manufacturing the semiconductor device described with reference to FIGS. 1 to 6.

Figure 18:
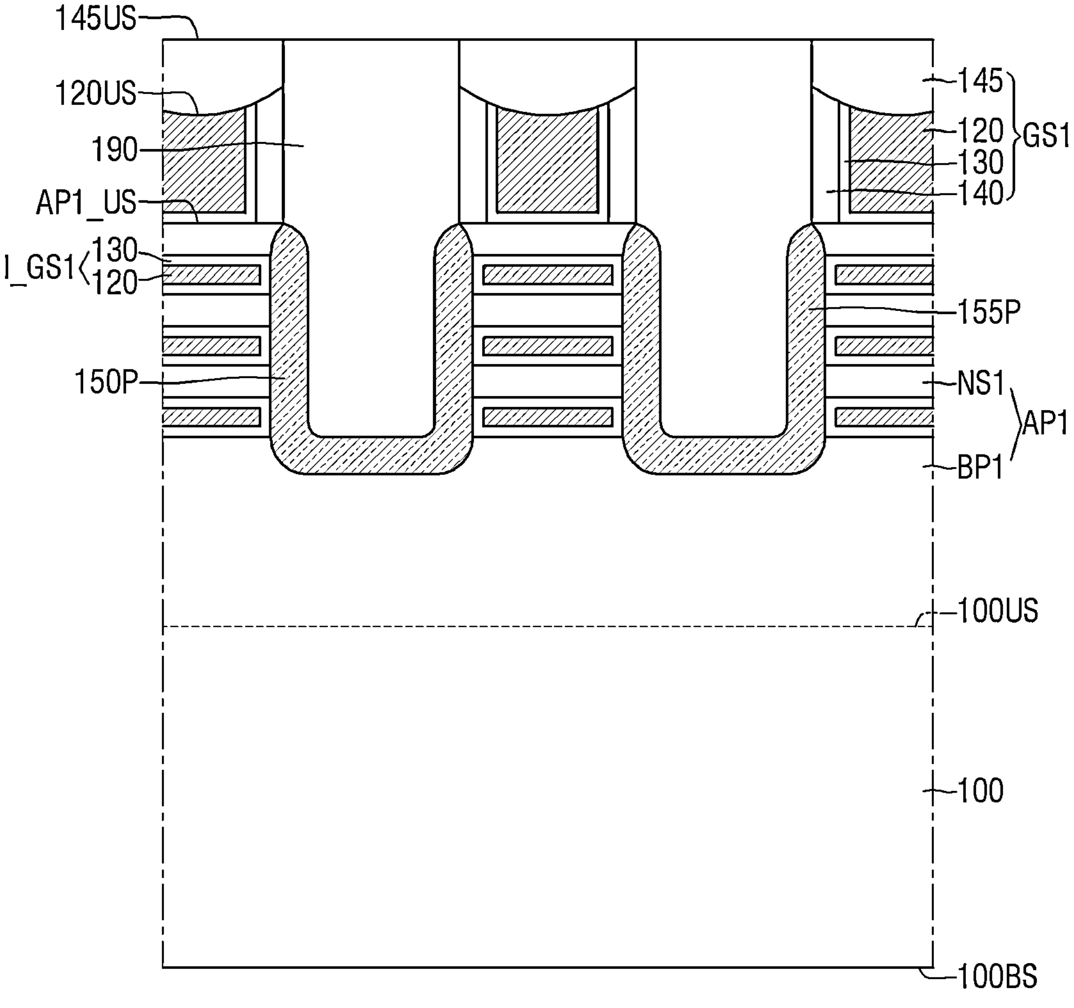
FIGS. 18 to 23 are intermediate operation views for describing a method for manufacturing a semiconductor device according to some embodiments.

Referring to FIG. 18, a first pre-source/drain pattern 150P and a second pre-source/drain pattern 155P are formed on the first lower pattern BP1.

In a cross-sectional view, the first pre-source/drain pattern 150P and the second pre-source/drain pattern 155P may have a "U" shape. Before the first pre-source/drain pattern 150P and the second pre-source/drain pattern 155P are formed, the first gate spacer 140 may be formed on the first lower pattern BP1.

The first interlayer insulating layer 190 may be formed on the first pre-source/drain pattern 150P and the second pre-source/drain pattern 155P. Subsequently, a first sheet pattern NS1 may be formed on the first lower pattern BP1. Through this, the first active pattern AP1 may be formed on the upper surface 100US of the substrate.

Subsequently, the first gate insulating layer 130 and the first gate electrode 120 surrounding the first sheet pattern NS1 may be formed on the first lower pattern BP1. The first gate capping pattern 145 may be formed on the first gate electrode 120. Through this, the first gate structure GS1 may be formed on the first active pattern AP1. The upper surface 145US of the first gate capping pattern may be on the same plane as the upper surface of a first interlayer insulating layer 190.

Figure 19:
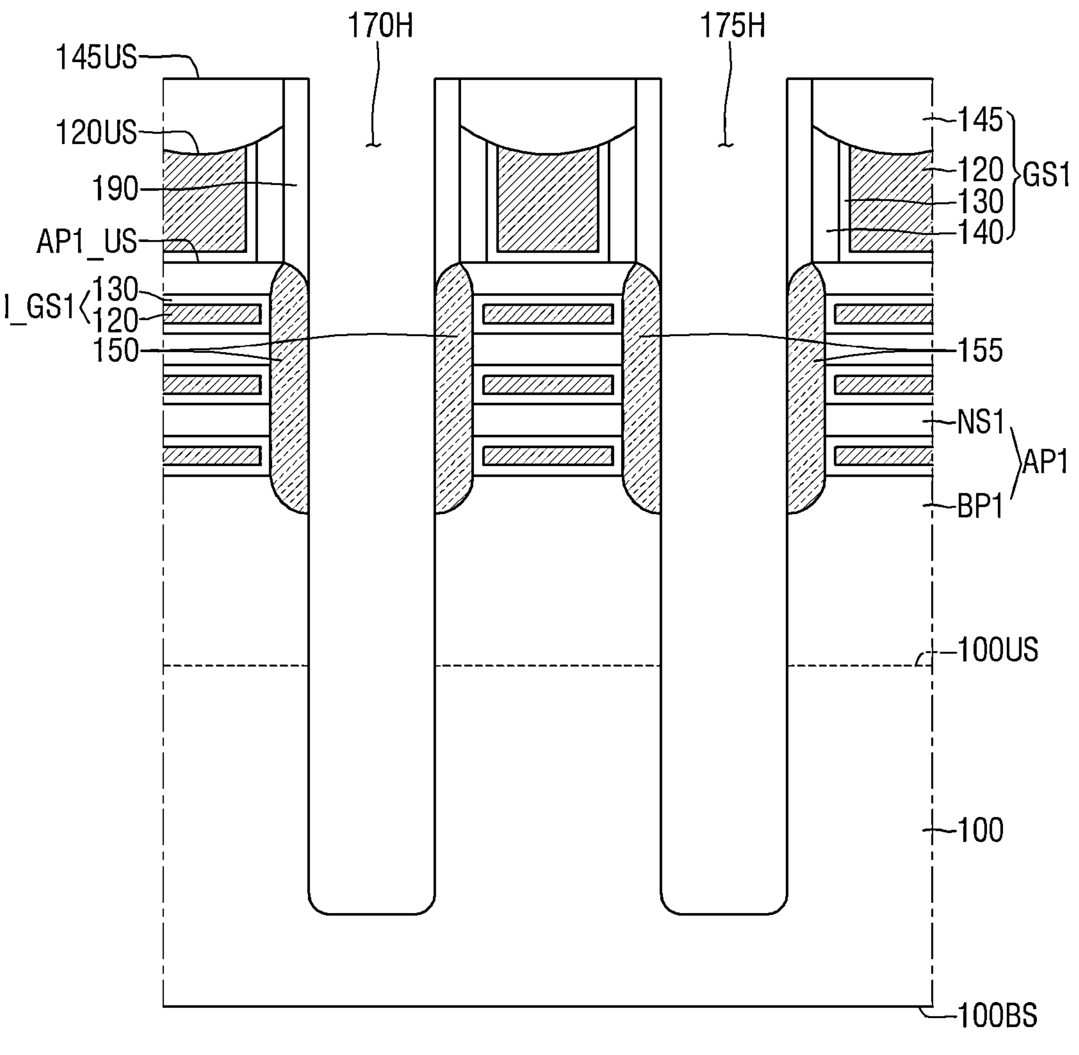

Referring to FIGS. 18 and 19, a first contact hole 170H and a second contact hole 175H may be formed in the first interlayer insulating layer 190, the first lower pattern BP1, and the substrate 100.

The first contact hole 170H may penetrate through the first pre-source/drain pattern 150P. The first contact hole 170H may separate the first pre-source/drain pattern 150P into two portions. The first source/drain patterns 150 separated by the first contact hole 170H may be formed on the first lower pattern BP1.

The second contact hole 175H may penetrate through the second pre-source/drain pattern 155P. The second contact hole 175H may separate the second pre-source/drain pattern 155P into two portions. The second source/drain patterns 155 separated by the second contact hole 175H may be formed on the first lower pattern BP1.

Figure 20:
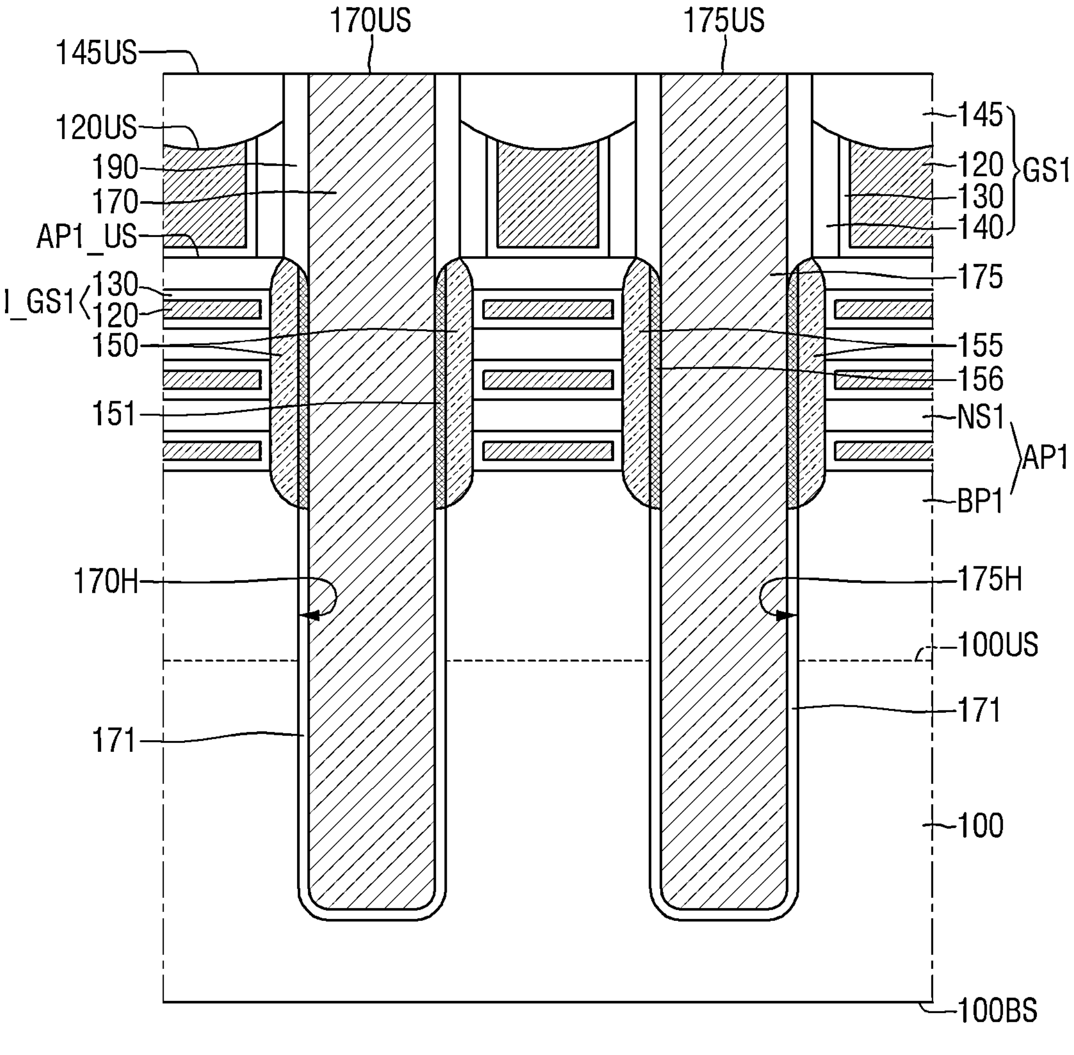

Referring to FIG. 20, the first power source/drain contact 170 may be formed in the first contact hole 170H. The first source/drain contact 175 may be formed in the second contact hole 175H.

The first contact silicide layer 151 may be formed between the first source/drain pattern 150 and the first power source/drain contact 170. The second contact silicide layer 156 may be formed between the second source/drain pattern 155 and the first source/drain contact 175.

Before the first power source/drain contact 170 and the first source/drain contact 175 are formed, the contact insulating liner 171 may be formed along a portion of a sidewall and a bottom surface of the first contact hole 170H. The contact insulating liner 171 may be formed along a portion of a sidewall and a bottom surface of the second contact hole 175H.

Figure 21:
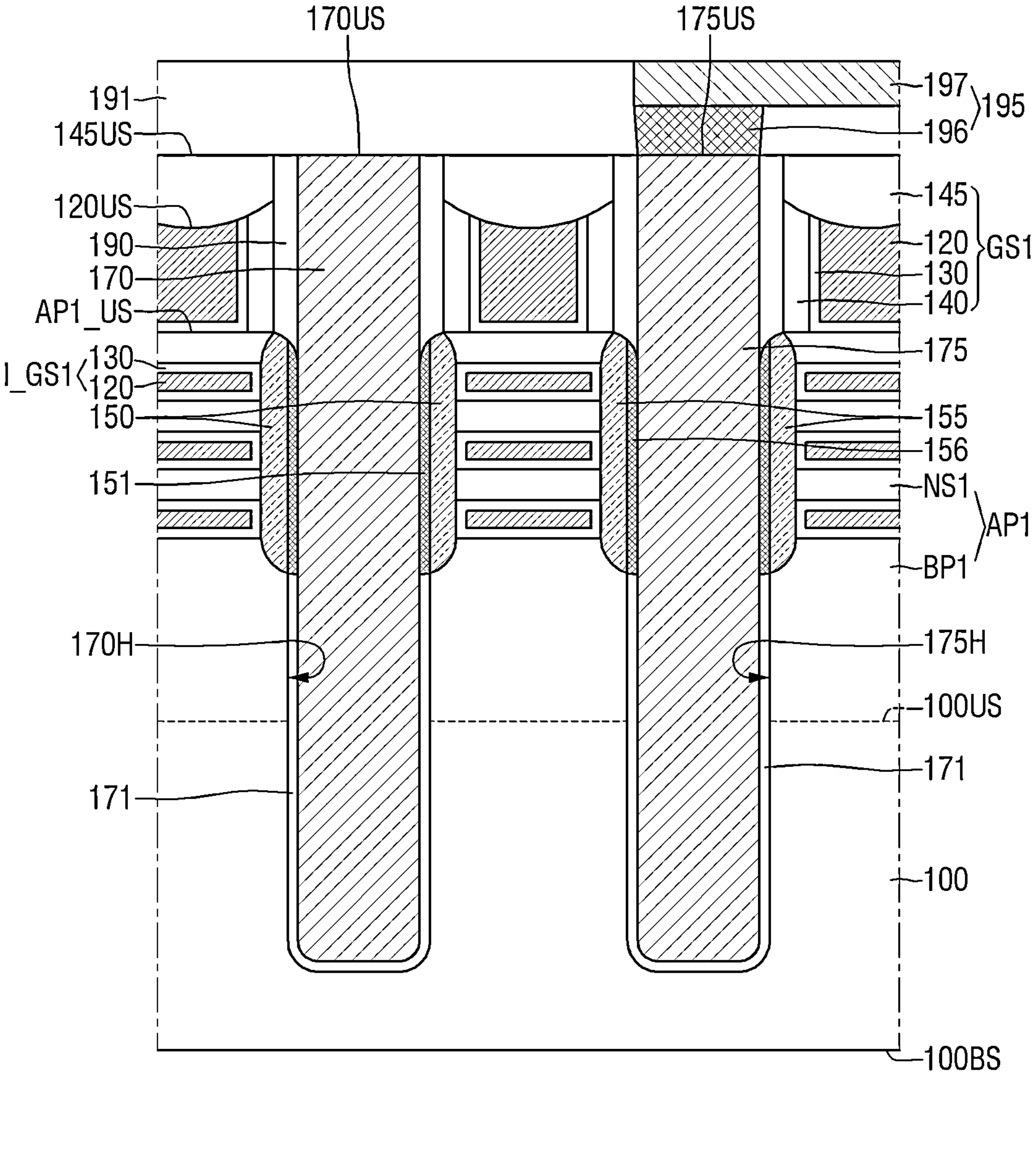

Referring to FIG. 21, the wiring structure 195 may be formed on the first gate structure GS1, the first power source/drain contact 170, and the first source/drain contact 175.

The wiring structure 195 may be connected to the first source/drain contact 175.

Figure 22:
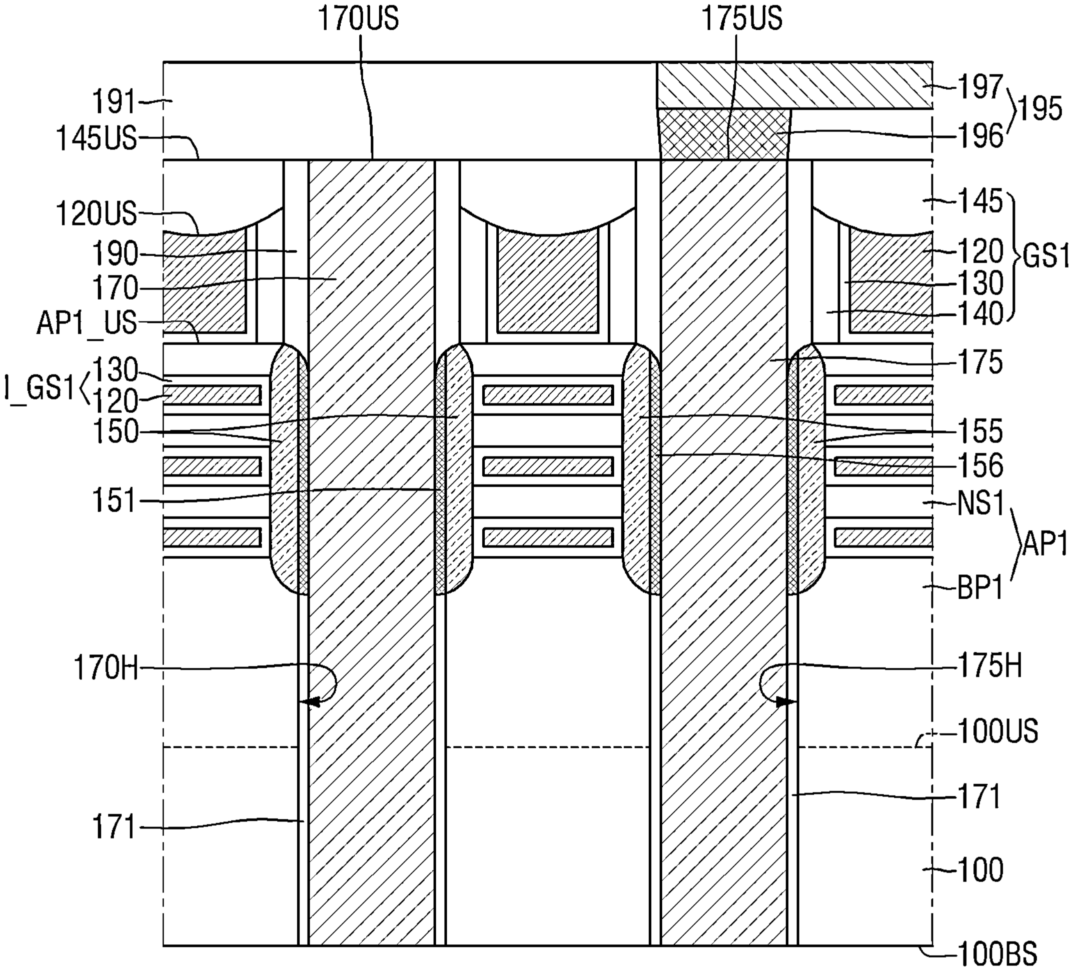

Referring to FIGS. 21 and 22, a portion of the substrate 100 may be removed to expose the first power source/drain contact 170 and the first source/drain contact 175.

Figure 23:
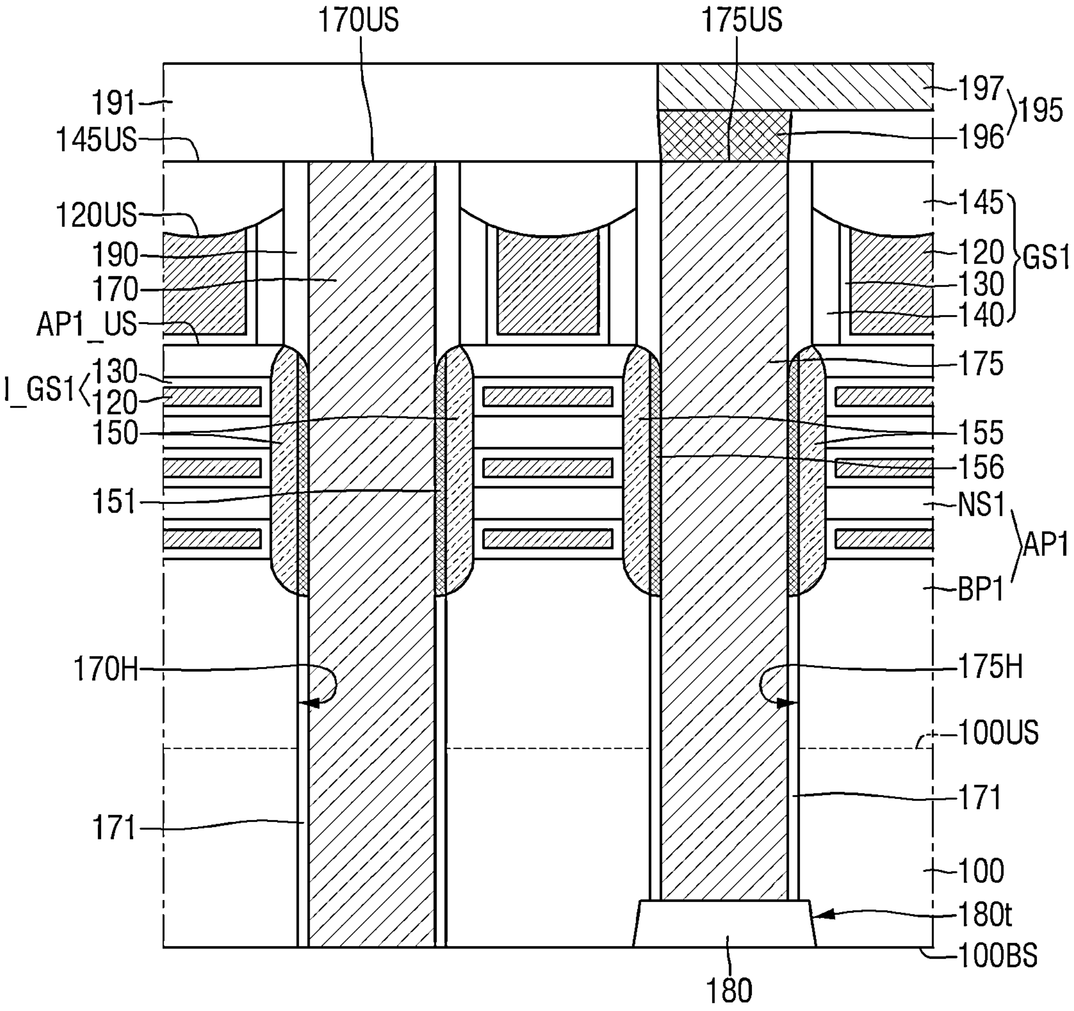

Referring to FIG. 23, the blocking trench 180*t* may be formed in the substrate 100.

The blocking trench 180*t* may be formed by removing a portion of the first source/drain contact 175 and a portion of the substrate 100.

The first contact blocking pattern 180 may be formed in the blocking trench 180*t*. The first contact blocking pattern 180 may be in contact with the first source/drain contact 175.

The first power source/drain contact 170 may be exposed from the lower surface 100BS of the substrate. The first source/drain contact 175 is not exposed from the lower surface 100BS of the substrate.

Subsequently, referring to FIG. 2, the first power line 50 and the second power line 60 may be formed on the lower surface 100BS of the substrate.

Although not illustrated, an electronic device may include the semiconductor device and a controller. Operations of the semiconductor devices according to example embodiments may be controlled by the controller. The controller may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The controller may operate in response to control signals, commands, and/or instructions input thereto from an external source (e.g., host). The controller may execute instructions stored in a memory for controlling operations of semiconductor device.

While some example embodiments of the present disclosure have been described above with reference to the accompanying drawings, inventive concepts may be implemented in various different forms. Those skilled in the art to which the present disclosure pertains may understand that embodiments of inventive concepts may be implemented in other specific forms without departing from the spirit and scope of inventive concepts. Therefore, it should be understood that the example embodiments described above are illustrative in all aspects and not restrictive.

What is claimed is:

1. A semiconductor device comprising:

a substrate including an upper surface and a lower surface that are opposite each other in a first direction;

a first sheet pattern on the upper surface of the substrate, the first sheet pattern including a first end and a second end;

a gate electrode extending in a second direction on the upper surface of the substrate, the gate electrode surrounding the first sheet pattern;

a first source/drain pattern connected to the first end of the first sheet pattern;

a second source/drain pattern connected to the second end of the first sheet pattern;

a contact blocking pattern on a lower side of the second source/drain pattern, the contact blocking pattern including an upper surface and a lower surface that are opposite each other in the first direction;

a first source/drain contact extending in the first direction, the first source/drain contact being connected to the first source/drain pattern; and a second source/drain contact in contact with the upper surface of the contact blocking pattern, the second source/drain contact extending in the first direction, and the second source/drain contact being connected to the second source/drain pattern, wherein a depth from an upper surface of the gate electrode to a lowermost portion of the first source/drain contact is greater than a depth from the upper surface of the gate electrode to the upper surface of the contact blocking pattern.

2. The semiconductor device of claim 1, further comprising:

a power line on the lower surface of the substrate, wherein the first source/drain contact is connected to the power line, and the second source/drain contact is not connected to the power line.

3. The semiconductor device of claim 2, wherein the depth from the upper surface of the gate electrode to the lowermost portion of the first source/drain contact is equal to a depth from the upper surface of the gate electrode to the lower surface of the contact blocking pattern.

4. The semiconductor device of claim 2, further comprising:

a wiring structure on the upper surface of the substrate, wherein the wiring structure is connected to the second source/drain contact.

5. The semiconductor device of claim 2, wherein a portion of the first source/drain contact and a portion of the second source/drain contact are in the substrate.

6. The semiconductor device of claim 1, further comprising:

a second sheet pattern on the upper surface of the substrate, the second sheet pattern including a third end and a fourth end;

a third source/drain pattern between the first source/drain pattern and the substrate, the third source/drain pattern being connected to the third end of the second sheet pattern; and a fourth source/drain pattern between the contact blocking pattern and the substrate, the fourth source/drain pattern being connected to the fourth end of the second sheet pattern, wherein the first source/drain contact is connected to the third source/drain pattern.

7. The semiconductor device of claim 6, wherein the depth from the upper surface of the gate electrode to the lowermost portion of the first source/drain contact is greater than a depth from the upper surface of the gate electrode to the lower surface of the contact blocking pattern.

8. The semiconductor device of claim 6, wherein the first source/drain contact and the second source/drain contact do not include a portion in the substrate.

9. A semiconductor device comprising:

a substrate including an upper surface and a lower surface that are opposite each other in a first direction;

a first sheet pattern on the upper surface of the substrate, the first sheet pattern including a first end and a second end;

a gate electrode extending in a second direction on the upper surface of the substrate, the gate electrode surrounding the first sheet pattern;

a first source/drain pattern connected to the first end of the first sheet pattern;

a second source/drain pattern connected to the second end of the first sheet pattern;

a first source/drain contact extending in the first direction, the first source/drain contact being connected to the first source/drain pattern; and a second source/drain contact extending in the first direction, the second source/drain contact being connected to the second source/drain pattern, wherein a depth from an upper surface of the gate electrode to a lowermost portion of the first source/drain contact is greater than a depth from the upper surface of the gate electrode to a lowermost portion of the first source/drain pattern, and a depth from the upper surface of the gate electrode to a lowermost portion of the second source/drain contact is greater than or equal to a depth from the upper surface of the gate electrode to a lowermost portion of the second source/drain pattern, wherein a height of the first source/drain contact in the first direction is greater than a height of the second source/drain contact in the first direction.

10. The semiconductor device of claim 9, further comprising:

a contact blocking pattern in the substrate, wherein the second source/drain contact is in contact with the contact blocking pattern.

11. The semiconductor device of claim 10, wherein the contact blocking pattern is spaced apart from a sidewall of the first source/drain contact in a second direction, and the second direction crosses the first direction.

12. The semiconductor device of claim 10, wherein the first source/drain contact penetrates through the substrate and extends to the lower surface of the substrate.

13. The semiconductor device of claim 10, further comprising:

a power line on the lower surface of the substrate, the power line being connected to the first source/drain contact; and a wiring structure on the upper surface of the substrate, the wiring structure being connected to the second source/drain contact, wherein the second source/drain contact is not connected to the power line.

14. The semiconductor device of claim 9, further comprising:

a second sheet pattern on the upper surface of the substrate, the second sheet pattern including a third end and a fourth end;

a third source/drain pattern between the first source/drain pattern and the substrate, the third source/drain pattern connected to the third end of the second sheet pattern; and a fourth source/drain pattern between the second source/drain pattern and the substrate, the fourth source/drain pattern connected to the fourth end of the second sheet pattern, wherein the first source/drain contact extends to the third source/drain pattern and is connected to the third source/drain pattern, and the second source/drain contact does not extend to the fourth source/drain pattern.

15. The semiconductor device of claim 14, further comprising:

a contact blocking pattern between the second source/drain pattern and the fourth source/drain pattern, wherein the second source/drain contact is in contact with the contact blocking pattern.

16. The semiconductor device of claim 14, wherein a depth from the upper surface of the gate electrode to the lowermost portion of the third source/drain pattern is greater than the depth from the upper surface of the gate electrode to the lowermost portion of the first source/drain contact.

17. A semiconductor device comprising:

a substrate including an upper surface and a lower surface that are opposite each other in a first direction;

a sheet pattern on the upper surface of the substrate, the sheet pattern including a first end and a second end;

a gate electrode extending in a second direction on the upper surface of the substrate, the gate electrode surrounding the sheet pattern;

a first source/drain pattern connected to the first end of the sheet pattern;

a second source/drain pattern connected to the second end of the sheet pattern;

a contact blocking pattern in the substrate;

a first source/drain contact connected to the first source/drain pattern, the first source/drain contact penetrating through the substrate; and a second source/drain contact connected to the second source/drain pattern, the second source/drain contact being in contact with the contact blocking pattern.

18. The semiconductor device of claim 17, wherein a depth from an upper surface of the gate electrode to a lowermost portion of the second source/drain contact is greater than a depth from the upper surface of the gate electrode to a lowermost portion of the second source/drain pattern.

19. The semiconductor device of claim 17, further comprising:

a power line on the lower surface of the substrate, wherein the first source/drain contact is connected to the power line, and the second source/drain contact is not connected to the power line.

20. The semiconductor device of claim 17, wherein a height from an upper surface of the gate electrode to an upper surface of the first source/drain contact is equal to a height from the upper surface of the gate electrode to an upper surface of the second source/drain contact.

* * * * *